US012662729B2

(12) United States Patent
Nakashima et al.

(10) Patent No.: US 12,662,729 B2
(45) Date of Patent: Jun. 23, 2026

(54) COMPOSITE FILM MANUFACTURING METHOD AND ORGANIC/INORGANIC HYBRID FILM MANUFACTURING METHOD

(71) Applicant: RIKEN TECHNOS CORPORATION, Tokyo (JP)

(72) Inventors: Kohei Nakashima, Tokyo (JP); Taketo Hashimoto, Tokyo (JP)

(73) Assignee: RIKEN TECHNOS CORPORATION, Tokyo (JP)

( * ) Notice: Subject to any disclaimer, the term of this patent is extended or adjusted under 35 U.S.C. 154(b) by 0 days.

(21) Appl. No.: 18/562,716

(22) PCT Filed: May 25, 2022

(86) PCT No.: PCT/JP2022/021334
§ 371 (c)(1),
(2) Date: Nov. 20, 2023

(87) PCT Pub. No.: WO2022/255179
PCT Pub. Date: Dec. 8, 2022

(65) Prior Publication Data
US 2024/0240305 A1      Jul. 18, 2024

(30) Foreign Application Priority Data
Jun. 4, 2021      (JP) ................................. 2021-093958

(51) Int. Cl.
| | |
|---|---|
| *C23C 14/34* | (2006.01) |
| *C23C 14/12* | (2006.01) |
| *C23C 14/56* | (2006.01) |

(52) U.S. Cl.
CPC .......... *C23C 14/3407* (2013.01); *C23C 14/12* (2013.01); *C23C 14/562* (2013.01)

(58) Field of Classification Search
CPC ... C23C 14/3407; C23C 14/12; C23C 14/562; C23C 14/0036; C23C 14/08;
(Continued)

(56) References Cited

U.S. PATENT DOCUMENTS

| | | | | |
|---|---|---|---|---|
| 4,522,844 A | * | 6/1985 | Khanna ................... | C23C 14/14 |
| | | | | 427/571 |
| 5,400,317 A | * | 3/1995 | Strasser ................. | C23C 14/35 |
| | | | | 204/192.27 |

(Continued)

FOREIGN PATENT DOCUMENTS

| | | | | |
|---|---|---|---|---|
| CN | 106676473 A | * | 5/2017 | ............. B32B 27/18 |
| EP | 0948662 B1 | | 3/2003 | |

(Continued)

OTHER PUBLICATIONS

WO-2019142830-A1 Translation (Year: 2019).*

(Continued)

*Primary Examiner* — Patrick S Ott

(74) *Attorney, Agent, or Firm* — RAPHAEL BELLUM PLLC

(57)      ABSTRACT

The present invention is a composite film manufacturing method in which a sputtering device is used and a gas of a substance with which can be prepared a mixed gas of a target of a solid substance in a standard state (a temperature of 25° C. and pressure of 100 KPa) (A) and a sputtering gas (B) is used. The method includes: (1) a step for attaching the target (A) to a target installation jig of the sputtering device; (2) a step for reducing the pressure inside a sputtering chamber of the sputtering device to a prescribed first pressure; (3) a step for introducing the mixed gas of the sputtering gas and the gas (B) into the sputtering chamber of the sputtering device such that the inside of the sputtering chamber reaches a second prescribed pressure (greater than or equal to the first prescribed pressure); and (4) a step for applying electric
(Continued)

power to the target (A) and using sputtering to form a composite film on the surface of a base material. The sputtering device may be a roll-to-roll scheme sputtering device.

18 Claims, 10 Drawing Sheets

(58) Field of Classification Search
CPC ... C23C 14/086; C23C 14/34; C23C 14/3414; C23C 14/3464; C23C 14/06; C08J 7/06; C08J 2367/02; C03C 17/008; C03C 2217/445; C03C 2217/475; C03C 2218/154
See application file for complete search history.

(56) References Cited

U.S. PATENT DOCUMENTS

| | | | | |
|---|---|---|---|---|
| 6,093,290 | A * | 7/2000 | Tamura | H01J 37/3455 |
| | | | | 204/192.12 |
| 6,893,720 | B1 * | 5/2005 | Nakahigashi | C08J 7/046 |
| | | | | 92/96 |
| 2003/0136662 | A1 * | 7/2003 | Ueda | H01J 37/3491 |
| | | | | 204/298.22 |
| 2008/0096044 | A1 * | 4/2008 | Matsumoto | H05K 3/241 |
| | | | | 205/102 |
| 2008/0199702 | A1 * | 8/2008 | Murphy | C03C 17/3441 |
| | | | | 427/454 |
| 2009/0152102 | A1 * | 6/2009 | Takemoto | C23C 14/0694 |
| | | | | 204/192.15 |
| 2010/0035036 | A1 | 2/2010 | McCloy et al. | |

| | | | | |
|---|---|---|---|---|
| 2014/0154424 | A1 * | 6/2014 | Oh | C23C 14/34 |
| | | | | 427/523 |
| 2018/0363128 | A1 * | 12/2018 | Tashiro | C23C 14/0057 |
| 2019/0316249 | A1 * | 10/2019 | Abraham | C23C 14/165 |
| 2020/0048470 | A1 * | 2/2020 | Bazin | C09C 1/0015 |

FOREIGN PATENT DOCUMENTS

| | | | | |
|---|---|---|---|---|
| JP | H03-14043 | B2 | | 2/1991 |
| JP | H06-506266 | A | | 7/1994 |
| JP | 07166344 | A | * | 6/1995 |
| JP | H07-166344 | A | | 6/1995 |
| JP | 08211201 | A | * | 8/1996 |
| JP | H08211201 | A | | 8/1996 |
| JP | 2001/100008 | A | | 4/2001 |
| JP | 2013/060632 | A | | 4/2013 |
| JP | 2014/040017 | A | | 3/2014 |
| JP | 2014/043101 | A | | 3/2014 |
| JP | 2019/059027 | A | | 4/2014 |
| JP | 2014/529185 | A | | 10/2014 |
| JP | 2019/123872 | A | | 7/2019 |
| WO | 92/17620 | A1 | | 10/1992 |
| WO | 2013/019608 | A1 | | 2/2013 |
| WO | WO-2019142830 | A1 | * | 7/2019 ............ B32B 27/18 |

OTHER PUBLICATIONS

CN-106676473-A Translation (Year: 2017).*
JP-07166344-A Translation (Year: 1995).*
JP-08211201-A Translation (Year: 1996).*
International Search Report of PCT Application No. PCT/JP2022/021334, dated Jul. 26, 2022.
Zheng et al., "Optical properties of sputter-deposited cerium oxyfluoride thin films," Applied Optics 1993, 32 (31), 6303-6309.

* cited by examiner

F1s SCAN

SURVEY

COMPOSITE FILM MANUFACTURING METHOD AND ORGANIC/INORGANIC HYBRID FILM MANUFACTURING METHOD

TECHNICAL FIELD

The present invention relates to a method for producing a composite film and a method for producing an organic/inorganic hybrid film.

BACKGROUND ART

Conventionally, for windows, windshields, and the like of automobiles, windows, doors, and the like of buildings, and protective plates, display faceplates, and the like of image display devices, articles containing inorganic glass as a base material have been used, because the inorganic glass is excellent in chemical stability and meets required properties such as transparency, rigidity, scratch resistance, and weather resistance. Meanwhile, inorganic glass has problems such as low impact resistance and ease of cracking, low processability, difficulty in handling, high specific gravity and heavy weight, and difficulty in meeting the demand for curved or flexible articles. Therefore, materials alternative to glass have been actively studied, and a transparent resin laminate has been proposed, in which a hard coating is laminated on a sheet or plate of a transparent resin such as a polycarbonate resin or an acrylic resin (see, for example, Patent Literature 1 and 2). However, the transparent resin laminate is insufficient in weather resistance and antifouling property, particularly in weather resistance as for applications in which the transparent resin laminate is used in environments exposed to ultraviolet rays.

Therefore, the present applicant has proposed to form an organic/inorganic hybrid film of a cerium oxide and an organofluorine compound on a surface of a transparent resin laminate. More specifically, the present applicant has proposed, as a method for producing the organic/inorganic hybrid film, a method for producing such film with the use of a sputtering device capable of performing two-pole sputtering and by using a target that is an organic material and a target that is an inorganic material, and a method for producing such film by using a target that is a mixture of an organic material and an inorganic material (see Patent Literature 3). Unfortunately, when an organic/inorganic hybrid film is to be formed with high productivity by a roll-to-roll method, the specification of the two-pole sputtering device is often complicated. As a result, it has been found that such techniques have the following disadvantages: the device has to be handled and set up severely, and it becomes difficult to industrially form an organic/inorganic hybrid film having stable quality (such as uniformity of the film thickness and composition); and it is difficult to industrially produce a target that is a mixture of an organic material and an inorganic material since methods and conditions suitable for producing a target are greatly different between the organic material and the inorganic material.

CITATION LIST

Patent Literature

PATENT LITERATURE 1: JP-A-2014-043101
PATENT LITERATURE 2: JP-A-2014-040017
PATENT LITERATURE 3: JP-A-2019-123872
PATENT LITERATURE 4: JP-A-2001-100008
PATENT LITERATURE 5: JP-A-03-014043

SUMMARY OF INVENTION

Technical Problem

An object of the present invention is to provide a novel method for producing a composite film.

Another object of the present invention is to provide a novel method for producing an organic/inorganic hybrid film.

Solution to Problem

As a result of intensive studies, the present inventors have found that the above-mentioned objects can be achieved by specific producing methods.

More specifically, aspects of the method for producing a composite film of the present invention are as follows.

[1].

A method for producing a composite film, wherein
a sputtering device is used, and
a target (A) that is a substance solid in a standard state (a temperature of 25° C. and a pressure of 100 KPa) and a gas (B) of a substance capable of providing a mixed gas with a sputtering gas are used, the method comprising the steps of:

(1) mounting the target (A) on a target installation jig of the sputtering device;

(2) reducing a pressure inside a sputtering chamber of the sputtering device to a first predetermined pressure;

(3) introducing a mixed gas of a sputtering gas and the gas (B) into the sputtering chamber of the sputtering device such that the pressure inside the sputtering chamber reaches a second predetermined pressure that is equal to or greater than the first predetermined pressure; and (4) supplying electric power to the target (A) and sputtering the target (A) to form the composite film on a surface of a base material.

[2].

The producing method according to item [1], wherein the sputtering device is a roll-to-roll sputtering device.

[3].

The producing method according to item [1] or [2], wherein a mixing ratio in the mixed gas (volume of the sputtering gas/volume of the gas (B): in terms of a standard state (0° C. and 1 atm)) is 60/40 to 99.999/0.001.

[4].

The producing method according to any one of items [1] to [3], wherein the gas (B) contains a gas of an organic compound.

[5].

The producing method according to item [4], wherein the gas of the organic compound contains a gas of one or more compounds selected from the group consisting of a compound that has a structure in which one or two or more hydrogen atoms of a saturated hydrocarbon are substituted with a fluorine atom and is gaseous in a standard state (a temperature of 25° C. and a pressure of 100 KPa), and a compound that has a structure in which one or two or more hydrogen atoms of an unsaturated hydrocarbon are substituted with a fluorine atom and is gaseous in a standard state (a temperature of 25° C. and a pressure of 100 KPa).

[6].

The producing method according to any one of items [1] to [5], wherein the target (A) is a target that is an inorganic substance.

[7].

The producing method according to item [6], wherein the target that is the inorganic substance contains an inorganic substance having a band gap of 2.6 to 3.7 eV.

[8].

The producing method according to item [6] or [7], wherein the target that is the inorganic substance contains a cerium oxide.

[9].

The producing method according to item [1], wherein the sputtering device is a roll-to-roll sputtering device;

a mixing ratio in the mixed gas (volume of the sputtering gas/volume of the gas (B): in terms of a standard state (0° C. and 1 atm)) is 60/40 to 99.999/0.001;

the gas (B) contains a gas of an organic compound;

the gas of the organic compound contains a gas of one or more compounds selected from the group consisting of a compound that has a structure in which one or two or more hydrogen atoms of a saturated hydrocarbon are substituted with a fluorine atom and is gaseous in a standard state (a temperature of 25° C. and a pressure of 100 KPa), and a compound that has a structure in which one or two or more hydrogen atoms of an unsaturated hydrocarbon are substituted with a fluorine atom and is gaseous in a standard state (a temperature of 25° C. and a pressure of 100 KPa);

the target (A) is a target that is an inorganic substance;

the target that is the inorganic substance contains an inorganic substance having a band gap of 2.6 to 3.7 eV; and the target that is the inorganic substance contains a cerium oxide.

[10].

The producing method according to any one of items [1] to [5], wherein the target (A) is a target that is an organic compound.

[11].

The producing method according to item [10], wherein the target that is the organic compound contains a silicone resin.

[12].

The producing method according to item [1], wherein the sputtering device is a roll-to-roll sputtering device;

a mixing ratio in the mixed gas (volume of the sputtering gas/volume of the gas (B): in terms of a standard state (0° ° C. and 1 atm)) is 60/40 to 99.999/0.001;

the gas (B) contains a gas of an organic compound;

the gas of the organic compound contains a gas of one or more compounds selected from the group consisting of a compound that has a structure in which one or two or more hydrogen atoms of a saturated hydrocarbon are substituted with a fluorine atom and is gaseous in a standard state (a temperature of 25° C. and a pressure of 100 KPa), and a compound that has a structure in which one or two or more hydrogen atoms of an unsaturated hydrocarbon are substituted with a fluorine atom and is gaseous in a standard state (a temperature of 25° C. and a pressure of 100 KPa);

the target (A) is a target that is an organic compound; and the target that is the organic compound contains a silicone resin.

Aspects of the method for producing an organic/inorganic hybrid film of the present invention are as follows.

[1a].

A method for producing an organic/inorganic hybrid film, wherein a sputtering device is used, and a target that is an inorganic substance and a gas of an organic compound are used, the method comprising the steps of:

(1) mounting the target that is the inorganic substance on a target installation jig of the sputtering device;

(2) reducing a pressure inside a sputtering chamber of the sputtering device to a first predetermined pressure;

(3) introducing a mixed gas of a sputtering gas and the gas of the organic compound into the sputtering chamber of the sputtering device such that the pressure inside the sputtering chamber reaches a second predetermined pressure that is equal to or greater than the first predetermined pressure; and (4) supplying electric power to the target that is the inorganic substance and sputtering the target to form an organic/inorganic hybrid film on a surface of a base material.

[2a].

The producing method according to item [1a], wherein the sputtering device is a roll-to-roll sputtering device.

[3a].

The producing method according to item [1a] or [2a], wherein a mixing ratio in the mixed gas (volume of the sputtering gas/volume of the gas of the organic compound: in terms of a standard state (0° ° C. and 1 atm)) is 60/40 to 99.999/0.001.

[4a].

The producing method according to any one of items [1a] to [3a], wherein the gas of the organic compound contains a gas of one or more compounds selected from the group consisting of a compound that has a structure in which one or two or more hydrogen atoms of a saturated hydrocarbon are substituted with a fluorine atom and is gaseous in a standard state (a temperature of 25° C. and a pressure of 100 KPa), and a compound that has a structure in which one or two or more hydrogen atoms of an unsaturated hydrocarbon are substituted with a fluorine atom and is gaseous in a standard state (a temperature of 25° C. and a pressure of 100 KPa).

[5a].

The producing method according to any one of items [1a] to [4a], wherein the target that is the inorganic substance contains an inorganic substance having a band gap of 2.6 to 3.7 eV.

[6a].

The producing method according to any one of items [1a] to [5a], wherein the target that is the inorganic substance contains a cerium oxide.

Advantageous Effects of Invention

As described above regarding the conventional formation of the organic/inorganic hybrid film, when a composite film is to be formed with high productivity by a roll-to-roll method, the specification of the two-pole sputtering device becomes complicated. As a result, there are disadvantages that the device has to be handled and set up severely, and it becomes difficult to industrially form a composite film having stable quality (such as uniformity of the film thickness and composition). In contrast, according to the method for producing a composite film of the present invention, such disadvantages are fundamentally solved. Therefore, the present method is suitable as a method for producing a composite film, particularly a producing method when a composite film is to be formed with high productivity by a roll-to-roll method.

As described above, when an organic/inorganic hybrid film is to be formed with high productivity by a roll-to-roll method, the specification of the two-pole sputtering device becomes complicated. As a result, there are the following disadvantages: the device has to be handled and set up severely, and it becomes difficult to industrially form an organic/inorganic hybrid film having stable quality (such as uniformity of the film thickness and composition); and it is difficult to industrially produce a target that is a mixture of an organic material and an inorganic material since methods and conditions suitable for producing a target are greatly different between the organic material and the inorganic material. In contrast, according to the method for producing an organic/inorganic hybrid film of the present invention, such disadvantages are fundamentally solved. Therefore, the present method is suitable as a method for producing an organic/inorganic hybrid film, particularly a producing method when an organic/inorganic hybrid film is to be formed with high productivity by a roll-to-roll method.

DESCRIPTION OF EMBODIMENTS

Figure 1:
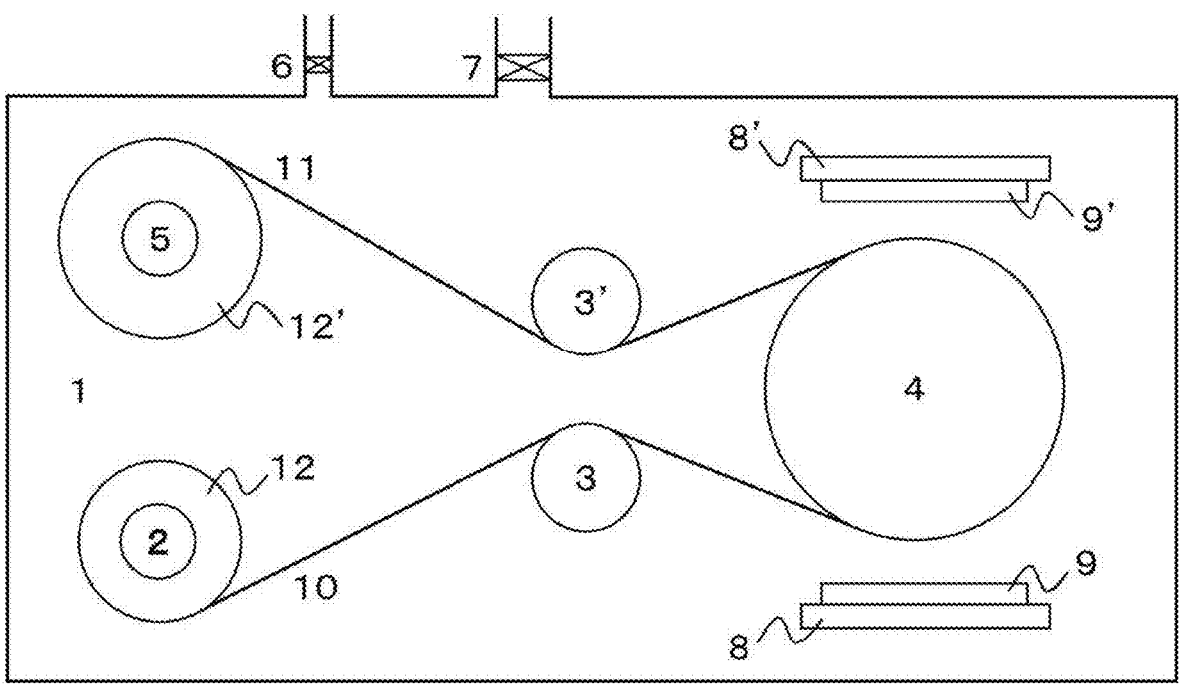
FIG. 1 is a conceptual diagram showing an example of a roll-to-roll sputtering device.

In the present description, the term "inorganic substance" is used as a term also including a mixture containing two or more kinds of inorganic substances. The term "organic compound" is used as a term also including a mixture containing two or more kinds of organic compounds. The term "resin" is used as a term also including a resin mixture containing two or more kinds of resins and a resin composition containing a component other than a resin.

In the present description, the term "film" is used interchangeably or replaceably with "sheet". In the present description, the terms "film" and "sheet" are used to describe those that can be industrially wound into a roll. The term "plate" is used to describe those that cannot be industrially wound into a roll. In the present description, sequentially laminating a certain layer and another layer includes both directly laminating the layers and laminating the layers with one or more other layers such as an anchor coating interposed therebetween.

In the present description, the term "or more" for a numerical range is used to mean a certain numerical value or greater than the certain numerical value. For example, 20% or more means 20% or greater than 20%. The term "or less" for a numerical range is used to mean a certain numerical value or less than the certain numerical value. For example, 20% or less means 20% or less than 20%. The term "to" or "-" for a numerical range is used to mean a certain numerical value, greater than the certain numerical value and less than a different certain numerical value, or the different certain numerical value. Herein, the different certain numerical value is a numerical value larger than the certain numerical value. For example, 10 to 90% means 10%, greater than 10% and less than 90%, or 90%. Moreover, any upper limit and any lower limit of a numerical range can be arbitrarily combined, and it can be read that there are embodiments in which an upper limit and a lower limit are arbitrarily combined. For example, from the description relating to a numerical range of a certain property of "usually 10% or more and preferably 20% or more, while usually 40% or less and preferably 30% or less" or "usually 10 to 40% and preferably 20 to 30%", it can be read that the numerical range of the certain property is 10 to 40%, 20 to 30%, 10 to 30%, or 20 to 40% in one embodiment.

Except in the examples or unless otherwise specified, all numerical values used in the description and claims are to be understood as modified by the term "about". Without intending to limit the application of the doctrine of equivalents to the claims, each numerical value should be construed in light of significant digits and by applying ordinary rounding techniques.

In the present description, terms that specify shapes and geometric conditions, for example, terms such as parallel, orthogonal, and perpendicular are intended to include substantially the same state in addition to the strict meaning.

In the present description, the "composite film" means a film containing atoms derived from each of two or more kinds of substances.

In the present description, the "organic/inorganic hybrid film" means a film containing an atom derived from an inorganic substance (the atom may constitute a molecule) and an atom derived from an organic compound (the atom may constitute a molecule).

In the method for producing a composite film of the present invention, a sputtering device is used, and a target (A) that is a substance solid in a standard state (a temperature of 25° C. and a pressure of 100 KPa) and a gas (B) of a substance capable of providing a mixed gas with a sputtering gas are used, and the method includes the steps of:

(1) mounting the target (A) on a target installation jig of the sputtering device;

(2) reducing a pressure inside a sputtering chamber of the sputtering device to a first predetermined pressure;

(3) introducing a mixed gas of a sputtering gas and the gas (B) into the sputtering chamber of the sputtering device such that the pressure inside the sputtering chamber reaches a second predetermined pressure that is equal to or greater than the first predetermined pressure; and (4) supplying electric power to the target (A) and sputtering the target (A) to form a composite film on a surface of a base material.

The composite film formed by the method for producing a composite film of the present invention contains an atom derived from the substance (A) solid in a standard state (a temperature of 25° C. and a pressure of 100 KPa) and an atom derived from the substance (B) capable of providing a mixed gas with a sputtering gas.

In a typical embodiment, the composite film formed by the method for producing a composite film of the present invention contains an atom derived from the substance (A) solid in a standard state (a temperature of 25° C. and a pressure of 100 KPa) and an atom derived from the substance (B) capable of providing a mixed gas with a sputtering gas, and may also contain one substance (which may be usually the substance (A) solid in a standard state (a temperature of 25° C. and a pressure of 100 KPa)) modified with the other substance (which may be usually the substance (B) capable of providing a mixed gas with a sputtering gas).

Hereinafter, the method for producing a composite film of the present invention is described mainly with reference to a case where it is the method for producing an organic/inorganic hybrid film.

When a composite film other than an organic/inorganic hybrid film is produced, it goes without saying that the method for producing a composite film of the present invention may be carried out by appropriately replacing the "organic/inorganic hybrid film" with the "composite film", the "target that is an inorganic compound" with the "target (A) that is a substance solid in a standard state (a temperature of 25° C. and a pressure of 100 KPa)", and the "gas of an organic compound" with the "gas (B) of a substance capable of providing a mixed gas with a sputtering gas".

1. Sputtering Device

In the method for producing a composite film of the present invention, a sputtering device is used.

Also in the method for producing an organic/inorganic hybrid film of the present invention, a sputtering device is used. The sputtering device is not particularly limited, and a known sputtering device can be used. The sputtering device is preferably a sputtering device having a mechanism of unwinding a film base material from a film roll, forming an organic/inorganic hybrid film on a surface of the film base material, and then winding up the resulting laminate into a film roll (hereinafter, the sputtering device is sometimes referred to as a "roll-to-roll sputtering device") from the viewpoint of forming an organic/inorganic hybrid film with high productivity.

FIG. 1 is a conceptual diagram showing an example of a roll-to-roll sputtering device. Hereinafter, the roll-to-roll sputtering device is described with reference to FIG. 1 as appropriate. The device in FIG. 1 includes, in a sputtering chamber 1, an unwinding roll 2, a transfer roll 3, a sputtering roll 4, a transfer roll 3', and a winding roll 5. These members enable to unwind a film base material 10 from a film roll 12 and form an organic/inorganic hybrid film (not shown) on a surface of the film base material 10, and then wind up a laminate 11 having the organic/inorganic hybrid film (not shown) on the surface of the film base material 10 into a film roll 12'.

The roll-to-roll sputtering device used may be a device having two or more sputtering rolls. It becomes easy to dispose two or more target installation jigs, so that it is possible to increase the film forming speed by using two or more targets and increase the line speed (productivity). In addition, it is also possible to form an anchor film (a film serving as anchor for enhancing interlayer adhesion strength between the film base material and the organic/inorganic hybrid film) on the surface of the film base material at the first sputtering roll, and then form the organic/inorganic hybrid film on a surface of the anchor film at the second and subsequent sputtering rolls. In this manner, a laminate having the film base material, the anchor film, and the organic/inorganic hybrid film can be obtained in one pass.

The sputtering chamber 1 has a sputtering gas inlet 6, and gases (a sputtering gas and a gas to be mixed with the sputtering gas) can be introduced into the sputtering chamber 1 from the sputtering gas inlet 6.

The sputtering chamber 1 has an exhaust port 7, and is capable of exhausting a gas from the exhaust port 7 using an exhaust device (not shown) to maintain a predetermined pressure. The exhaust device is not particularly limited as long as it has a capability of maintaining the predetermined pressure. Examples of the exhaust device include a positive displacement vacuum pump such as an oil rotary pump, a momentum transfer vacuum pump such as a turbo molecular pump, a gas storage vacuum pump such as a cryopump, and a combination thereof.

The device in FIG. 1 has two target installation jigs 8 and 8', and one target 9 and one target 9' (two targets in total) can be mounted on the target installation jigs 8 and 8', respectively. The targets 9 and 9' respectively mounted on the target installation jigs 8 and 8' are connected to different impedance matchers (not shown) and high frequency power supplies (not shown) so that film formation conditions can be appropriately changed. Thus, the electric power supplied to the targets 9 and 9' can be individually controlled. In addition, a flow path for a medium such as water is provided inside each of the target installation jigs 8 and 8', so that the temperature of each of the targets 9 and 9' can be controlled to a predetermined temperature.

The targets 9 and 9' respectively mounted on the target installation jigs 8 and 8' are disposed to face the sputtering roll 4. The distance between the target 9 and the sputtering roll 4 (or, the distance between the target 9' and the sputtering roll 4) is not particularly limited, but may be usually about 1 to 20 cm, preferably about 3 to 15 cm, and more preferably about 5 to 12 cm.

2. Target (A) that is Substance Solid in Standard State

In the method for producing a composite film of the present invention, a target (A) that is a substance solid in a standard state (a temperature of 25° C. and a pressure of 100 KPa) is used. Specifically, the composite film produced by the method for producing a composite film of the present invention contains an atom derived from the substance (A) solid in a standard state (a temperature of 25° C. and a pressure of 100 KPa).

The substance (A) is not particularly limited as long as it is a substance capable of stably maintaining a solid state in a standard state (a temperature of 25° C. and a pressure of 100 KPa), and preferably a substance capable of stably maintaining a solid state in a standard state (a temperature of 25° C. and a pressure of 100 KPa) and at a pressure and a temperature in each step in forming the composite film.

The substance (A) may be an inorganic substance or an organic compound.

Examples of the organic compound include a silicone resin. The silicone resin is a polymer compound having a siloxane bond (Si—O—Si) as a main backbone.

The silicone resin is not particularly limited as long as it has such a structure, and examples thereof include polydimethylsiloxane, polydiethylsiloxane, polymethylphenylsiloxane, polydiphenylsiloxane, and modified products thereof. These compounds can be used singly or in a mixture of two or more kinds thereof as the silicone resin.

The substance (A) can be appropriately selected from substances capable of stably maintaining a solid state in a standard state (a temperature of 25° C. and a pressure of 100 KPa), and preferably from substances capable of stably maintaining a solid state in a standard state (a temperature of 25° C. and a pressure of 100 KPa) and at a pressure and a temperature in each step in forming the composite film, in consideration of properties and functions to be imparted to the composite film.

From the viewpoint of handleability, it is preferable that the substance (A) be shaped by a known method, and the shaped body be used as a target. When the substance (A) is an inorganic substance, examples of the shaping method include sintering. When the substance (A) is an organic compound, examples of the shaping method include injection molding and casting solidification. The shape of the target that is the substance (A) can be appropriately selected from the viewpoint of making the film thickness of the composite film uniform in consideration of the specification of the sputtering device used.

2-1. Target that is Inorganic Substance

In the method for producing an organic/inorganic hybrid film of the present invention, a target that is an inorganic substance is used.

Specifically, the organic/inorganic hybrid film produced by the method for producing an organic/inorganic hybrid film of the present invention contains an atom derived from the inorganic substance.

The inorganic substance is not particularly limited as long as it is an inorganic substance capable of stably maintaining a solid state in a standard state (a temperature of 25° C. and a pressure of 100 KPa), and preferably an inorganic substance capable of stably maintaining a solid state in a standard state (a temperature of 25° C. and a pressure of 100 KPa) and at a pressure and a temperature in each step in forming the organic/inorganic hybrid film.

The inorganic substance can be appropriately selected from inorganic substances capable of stably maintaining a solid state in a standard state (a temperature of 25° C. and a pressure of 100 KPa), and preferably from inorganic substances capable of stably maintaining a solid state in a standard state (a temperature of 25° C. and a pressure of 100 KPa) and at a pressure and a temperature in each step in forming the organic/inorganic hybrid film, in consideration of properties and functions to be imparted to the organic/inorganic hybrid film.

Examples of the inorganic substance used for imparting low ultraviolet transmittance to the organic/inorganic hybrid film include inorganic substances usually having a band gap of 3.7 eV or less, preferably 3.6 eV or less, more preferably 3.5 eV or less, still more preferably 3.4 eV or less, even more preferably 3.3 eV or less, and most preferably 3.25 eV or less from the viewpoint of sufficiently lowering the transmittance of ultraviolet rays having an energy equal to or greater than the energy of carbon-carbon bond of the organic compound (that is, 3.82 eV), and further from the viewpoint of sufficiently lowering the transmittance of ultraviolet rays having a wavelength of 380 nm (and having an energy of 3.26 eV).

Examples of the inorganic substance used for imparting high visible light transmittance to the organic/inorganic hybrid film include inorganic substances usually having a band gap of 2.6 eV or more, preferably 2.7 eV or more, more preferably 2.8 eV or more, still more preferably 2.9 eV or more, even more preferably 3.0 eV or more, still even more preferably 3.1 eV or more, and most preferably 3.15 eV or more from the viewpoint of sufficiently transmitting visible light having a wavelength of 490 nm or more (energy of visible light having a wavelength of 490 nm is 2.53 eV), and further from the viewpoint of sufficiently transmitting visible light having a wavelength of 400 nm or more (energy of visible light having a wavelength of 400 nm is 3.10 eV).

Herein, the band gap is an energy level between the top of the highest energy band occupied by electrons and the bottom of the lowest empty band in the crystal band structure of the inorganic substance. When a photon is incident on a substance having a band gap smaller than the energy of the photon, a phenomenon in which an electron is excited by the photon and the photon is reflected (that is, the photon is not transmitted) occurs with high probability. In contrast, when a photon is incident on a substance having a band gap larger than the energy of the photon, a phenomenon in which an electron is not excited by the photon and the photon is transmitted occurs with high probability. Although not intended to be bound by theory, it is considered that an organic/inorganic hybrid film having low ultraviolet transmittance and high visible light transmittance can be formed by using an inorganic substance having a band gap smaller than the energy of ultraviolet rays and larger than the energy of visible light, that is, as described above, by using an inorganic substance having a band gap of 3.7 eV or less, 3.6 eV or less, 3.5 eV or less, 3.4 eV or less, 3.3 eV or less, or 3.25 eV or less, and (in combination with any of these upper limits) a band gap of 2.6 eV or more, 2.7 eV or more, 2.8 eV or more, 2.9 eV or more, 3.0 eV or more, 3.1 eV or more, or 3.15 eV or more.

Examples of the inorganic substance used for imparting low ultraviolet transmittance and high visible light transmittance to the organic/inorganic hybrid film include cerium oxides such as cerium dioxide (3.2 eV) and dicerium trioxide, titanium dioxide (anatase type: 3.2 eV, rutile type: 3.0 eV), gallium nitride (3.4 eV), zinc oxide (3.37 eV), zinc sulfide (3.6 eV), and silicon carbide (2.86 eV). The numerical values in the parentheses indicate band gaps. Among them, cerium oxides such as cerium dioxide (3.2 eV) and dicerium trioxide, and anatase-type titanium dioxide are preferable, and cerium dioxide is more preferable.

These compounds can be used singly or in a mixture of two or more kinds thereof as the inorganic substance.

From the viewpoint of handleability, it is preferable that the inorganic substance be shaped in advance by a known method such as sintering, and the shaped body such as a sintered body be used as a target. The shape of the target (shaped body such as a sintered body) that is the inorganic substance can be appropriately selected from the viewpoint of making the film thickness of the organic/inorganic hybrid film uniform in consideration of the specification of the sputtering device used.

When a roll-to-roll sputtering device is used as the sputtering device, the shape of the target that is the inorganic substance can be appropriately selected in consideration of the specification (width and diameter) of the sputtering roll disposed to face the target, the distance between the target and the sputtering roll, the width of the film base material used, and the effective width of the laminate (i.e., the width of the laminate as a final product) having the organic/inorganic hybrid film on a surface of the film base material, so that the film thickness and composition of the organic/inorganic hybrid film may be made uniform within the effective width of the laminate. The shape of the target that is the inorganic substance can be appropriately selected particularly from the viewpoint of preventing the film thickness and the composition from varying in the lateral direction and from the viewpoint of reducing contamination of the sputtering roll.

When a roll-to-roll sputtering device is used as the sputtering device, the target that is the inorganic substance may have a rectangular parallelepiped shape. The lateral length of the rectangular parallelepiped (that is, the length of the side (usually, the long side) of the vertical and horizontal surfaces of the rectangular parallelepiped target facing the sputtering roll, the side corresponding to the width direction of the sputtering roll) may be usually a length equal to or longer than the effective width of the laminate, preferably a length equal to or longer than the width of the film base material, and more preferably a length equal to or longer than the width of the film base material+3 cm from the viewpoint of increasing the uniformity of the film thickness and composition of the organic/inorganic hybrid film to widen the effective width of the laminate.

Figure 2:
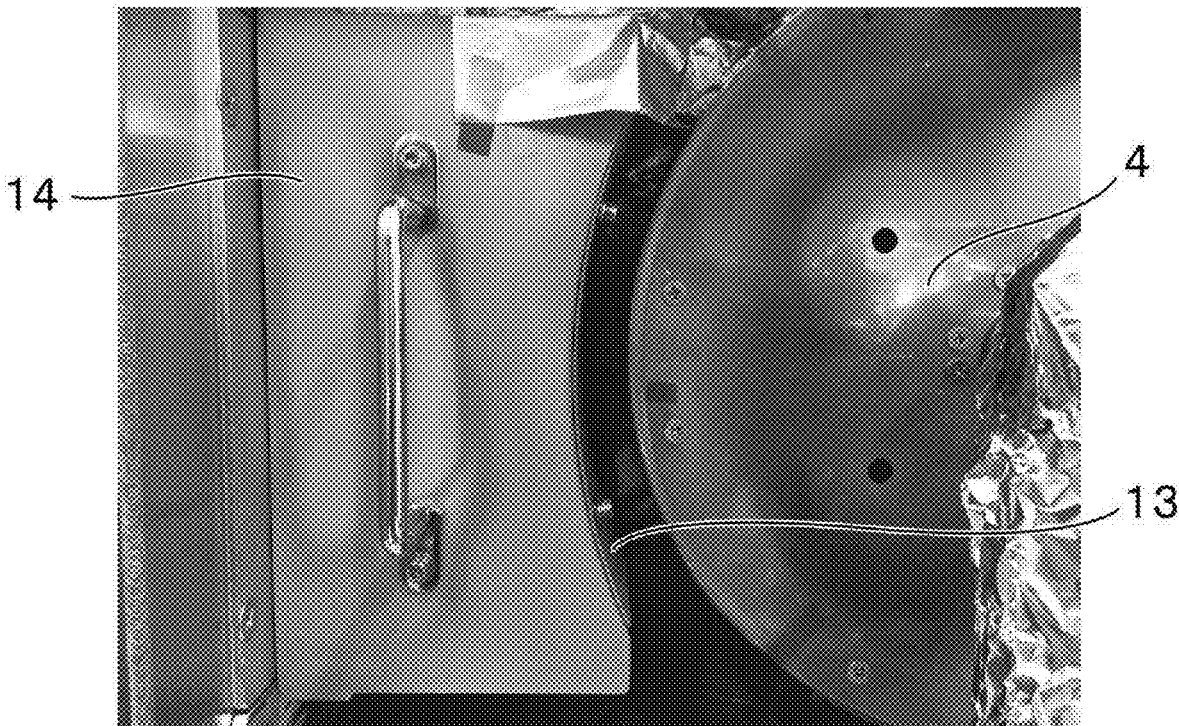
FIG. 2 is a photograph showing an example of a roll-to-roll sputtering device provided with a deposition preventive plate.

From the viewpoint of reducing contamination of the sputtering roll, it is one of preferred embodiments to provide a deposition preventive plate having a shape for masking sides of the sputtering roll between the target and the sputtering roll at a position facing each of both sides of the sputtering roll. Herein, the wording "sides of the sputtering roll" means portions where the sputtering roll is exposed at the sides of a portion covered with the film base material in a state where the film base material is held on the sputtering roll. FIG. 2 is a photograph showing an example of a roll-to-roll sputtering device provided with a deposition preventive plate. In the device in FIG. 2, a deposition preventive plate 13 having a shape for masking a side of the sputtering roll 4 is attached to a position facing the side of the sputtering roll 4 by a deposition preventive plate attaching jig 14. The target that is the inorganic substance is installed so as to face the sputtering roll 4 in a space constituted by the deposition preventive plate 13, the deposition preventive plate attaching jig 14, a deposition preventive plate on the side opposite to the side shown in the photograph, and a deposition preventive plate attaching jig on the side opposite to the side shown in the photograph.

When the sputtering roll has a width of 70 cm and a diameter of 40 cm, the distance between the target and the sputtering roll is 8 cm, the film base material has a width of 50 cm, and the laminate has an effective width of 40 cm, the shape of the target that is the inorganic substance may be, for example, a rectangular parallelepiped having an approximate size that is usually 1 to 30 cm, preferably 5 to 20 cm in vertical length, usually 40 to 60 cm, preferably 53 to 58 cm in horizontal length, and usually 0.1 to 5 cm, preferably 0.2 to 2 cm in height.

3. Gas (B) of Substance Capable of Providing Mixed Gas with Sputtering Gas

In the method for producing a composite film of the present invention, a gas (B) of a substance capable of providing a mixed gas with a sputtering gas is used.

Specifically, the composite film produced by the method for producing a composite film of the present invention contains an atom derived from the substance (B) capable of providing a mixed gas with a sputtering gas.

As described above, when a composite film is to be formed with high productivity by a roll-to-roll method, the specification of the two-pole sputtering device becomes complicated. As a result, there are disadvantages that the device has to be handled and set up severely, and it becomes difficult to industrially form a composite film having stable quality (such as uniformity of the film thickness and composition). In the method for producing a composite film of the present invention, a gas is used and no target is used as one of substances for forming the composite film. Therefore, according to the method for producing a composite film of the present invention, the above-mentioned disadvantages are fundamentally solved.

The substance (B) capable of providing a mixed gas with a sputtering gas is not particularly limited as long as it is a substance capable of providing a mixed gas with the sputtering gas, that is, a substance capable of stably maintaining a gaseous state at a pressure and a temperature in each step in forming the composite film.

The substance (B) capable of providing a mixed gas with a sputtering gas is not limited to a substance that is gaseous in a standard state (a temperature of 25° C. and a pressure of 100 KPa).

The substance (B) capable of providing a mixed gas with a sputtering gas may be a substance that becomes gaseous by heating (usually, the temperature is equal to or less than the upper limit temperature at which the film base material can be practically used) or/and pressure reduction.

The substance (B) capable of providing a mixed gas with a sputtering gas may be preferably a substance that is gaseous in a standard state (a temperature of 25° C. and a pressure of 100 KPa) from the viewpoint of operability in mixing the sputtering gas with the gas (B) of substance capable of providing a mixed gas with a sputtering gas to prepare a mixed gas of both the gases.

The substance (B) capable of providing a mixed gas with a sputtering gas may be an organic compound or an inorganic substance.

The substance (B) capable of providing a mixed gas with a sputtering gas can be appropriately selected from substances capable of stably maintaining a gaseous state at a pressure and a temperature in each step in forming the composite film in consideration of properties and functions to be imparted to the composite film.

3-1. Gas of Organic Compound

In the method for producing an organic/inorganic hybrid film of the present invention, a gas of an organic compound is used.

Specifically, the organic/inorganic hybrid film produced by the method for producing an organic/inorganic hybrid film of the present invention contains an atom derived from the gas of the organic compound.

As described above, when an organic/inorganic hybrid film is to be formed with high productivity by a roll-to-roll method, there are at least two disadvantages: specifically, a disadvantage that the specification of the two-pole sputtering device becomes complicated, and as a result, the device has to be handled and set up severely, and it becomes difficult to industrially form an organic/inorganic hybrid film having stable quality (such as uniformity of the film thickness and composition), and a disadvantage that it is difficult to industrially produce a target that is a mixture of an organic material and an inorganic material since methods and conditions suitable for producing a target are greatly different between the organic material and the inorganic material. In contrast, in the method for producing an organic/inorganic hybrid film of the present invention, a gas is used as the organic compound, and no organic compound target (i.e., a shaped body as an organic compound target) is used. Therefore, according to the method for producing an organic/inorganic hybrid film of the present invention, both of the above-mentioned two disadvantages are fundamentally solved.

The organic compound is not particularly limited as long as it is an organic compound capable of stably maintaining a gaseous state at a pressure and a temperature in each step in forming the organic/inorganic hybrid film. The organic compound is not limited to an organic compound that is gaseous in a standard state (a temperature of 25° C. and a pressure of 100 KPa). The organic compound may be an organic compound that becomes gaseous by heating (usually, the temperature is equal to or less than the upper limit temperature at which the film base material can be actually used) or/and pressure reduction. The organic compound may be preferably an organic compound that is gaseous in a standard state (a temperature of 25° C. and a pressure of 100 KPa) from the viewpoint of workability in mixing the sputtering gas with a gas of the organic compound to prepare a mixed gas of the gas and the compound.

The organic compound can be appropriately selected from organic compounds capable of stably maintaining a gaseous state at a pressure and a temperature in each step in forming the organic/inorganic hybrid film in consideration of properties and functions to be imparted to the organic/inorganic hybrid film.

Examples of the organic compound used for imparting a water repellent function and antifouling property to the organic/inorganic hybrid film include an organofluorine compound. The organofluorine compound is a compound having a fluorine-carbon bond. Typically, the organofluorine compound is a compound having a structure in which one or two or more hydrogen atoms of an organic compound such as a hydrocarbon are substituted with a fluorine atom. The organofluorine compound may be preferably an organic compound that is gaseous in a standard state (a temperature of 25° C. and a pressure of 100 KPa).

Examples of the organofluorine compound include a compound that has a structure in which one or two or more hydrogen atoms of a saturated hydrocarbon are substituted with a fluorine atom and that is gaseous in a standard state (a temperature of 25° C. and a pressure of 100 KPa), such as tetrafluoromethane, trifluoromethane, difluoromethane, fluoromethane, and 1,1,1,2-tetrafluoroethane; and a compound that has a structure in which one or two or more hydrogen atoms of an unsaturated hydrocarbon are substituted with a fluorine atom and that is gaseous in a standard state (a temperature of 25° C. and a pressure of 100 KPa), such as a compound that has a structure in which one or two or more hydrogen atoms of an α-olefin are substituted with a fluorine atom, such as tetrafluoroethylene, trifluoroethylene, vinylidene fluoride, vinyl fluoride, hexafluoropropylene, pentafluoropropylene, tetrafluoropropylene, trifluoropropylene, and chlorotrifluoroethylene.

These compounds can be used singly or in a mixture of two or more kinds thereof as the organic compound.

4. Base Material

The method for producing a composite film of the present invention includes forming the composite film on at least one surface of a base material (i.e., only on one surface of the base material or on both surfaces of the base material).

The base material can be appropriately selected according to the application of the laminate or shaped body having the composite film on at least one surface of the base material. Hereinafter, the laminate or the shaped body may be simply referred to as "the laminate" in the sense of the laminate or the shaped body having the composite film on at least one surface of the base material. Herein, it should be noted that the simple wording "the laminate" is also intended to mean the laminate or the shaped body having the organic/inorganic hybrid film on at least one surface of the base material.

The method for producing an organic/inorganic hybrid film of the present invention includes forming the organic/inorganic hybrid film on at least one surface of a base material.

The base material can be appropriately selected according to the application of the laminate or shaped body having the organic/inorganic hybrid film on at least one surface of the base material. Hereinafter, the laminate or the shaped body may be simply referred to as "the laminate" in the sense of the laminate or the shaped body having the organic/inorganic hybrid film on at least one surface of the base material.

A surface of the base material on which the composite film is to be formed may be smooth (entirely or partially), or may have a three-dimensional shape such as irregularities (entirely or partially). The "three-dimensional shape" generally means a shape including a non-flat surface.

A surface of the base material on which the organic/inorganic hybrid film is to be formed may be smooth (entirely or partially), or may have a three-dimensional shape such as irregularities (entirely or partially).

In one of typical embodiments, the base material is a film, a sheet, or a plate.

Examples of the base material include inorganic glass films, inorganic glass sheets, and inorganic glass plates of soda-lime glass, borosilicate glass, and quartz glass.

Examples of the base material include resin films, resin sheets, or resin plates of cellulose ester resins such as triacetyl cellulose; polyester resins such as polyethylene terephthalate; cyclic hydrocarbon resins such as an ethylene/norbornene copolymer; acrylic resins such as polymethyl methacrylate, polyethyl methacrylate, and a vinyl cyclohexane/methyl (meth)acrylate copolymer; aromatic polycarbonate resins; polyolefin resins such as polypropylene and 4-methyl-pentene-1; polyamide resins; polyarylate resins; polymer type urethane acrylate resins; and polyimide resins. These resin films include an unstretched film, a uniaxially stretched film, and a biaxially stretched film. In addition, these resin films include a laminated resin film obtained by laminating two or more layers of one or two or more kinds of these. These resin sheets include an unstretched sheet, a uniaxially stretched sheet, and a biaxially stretched sheet. In addition, these resin sheets include a laminated resin sheet obtained by laminating two or more layers of one or two or more kinds of these. These resin plates include a laminated resin plate obtained by laminating two or more layers of one or two or more kinds of these.

The base material used may be a base material having a functional layer on at least one surface thereof. (Examples of the base material include a base material having no functional layer on either surface, a base material having a functional layer only on one surface, and a base material having a functional layer on both surfaces.)

The surface on which the composite film is to be formed may be a surface on the functional layer side or a surface reverse to the functional layer.

It is possible to use, as the base material, one having a functional layer on at least one surface of the resin film, the resin sheet, or the resin plate, and the surface on which the organic/inorganic hybrid film is to be formed may be a surface on the functional layer side or a surface reverse to the functional layer.

Specifically, the composite film or the organic/inorganic hybrid film may be directly formed on the base material without the functional layer interposed therebetween, or may be formed over the base material with the functional layer interposed therebetween.

Examples of the functional layer include layers having functions such as a hardness improving function, an anchor function, a low refractive index, a high refractive index, infrared ray shielding, infrared ray reflection, ultraviolet ray shielding, electromagnetic wave shielding, electromagnetic wave reflection, field of view control (blindness), and viewing angle control. The functional layer may be a coating film (including a hard coat) formed using a coating material. The functional layer may be a film formed by a dry coating method such as a sputtering method, a vacuum vapor deposition method, or a chemical vapor deposition method.

When inorganic glass is used as the base material, the thickness of the inorganic glass film, the inorganic glass sheet, or the inorganic glass plate is not particularly limited, and can be set to any thickness as desired. The thickness may be usually 20 μm or more, and preferably 50) μm or more from the viewpoint of handleability of the laminate. The thickness may be usually 0.8 mm or more, preferably 1 mm or more, and more preferably 1.5 mm or more from the viewpoint of impact resistance of the inorganic glass. The thickness may be usually 6 mm or less, preferably 4.5 mm or less, and more preferably 3 mm or less from the viewpoint of weight reduction of an article containing the laminate.

When a resin is used as the base material, the thickness of the resin film, the resin sheet, or the resin plate is not particularly limited, and can be set to any thickness as desired. The thickness may be usually 20 μm or more, and preferably 50 μm or more from the viewpoint of handleability of the laminate. When the laminate is used for applications not requiring high rigidity, the thickness of the laminate may be usually 250 μm or less, and preferably 150 μm or less from the viewpoint of economic efficiency. When the laminate is used for applications requiring high rigidity, the thickness of the laminate may be usually 300 μm or more, preferably 500 μm or more, and more preferably 600 μm or more from the viewpoint of maintaining rigidity: From the viewpoint of meeting the demand for reducing the thickness of an article containing the laminate, the thickness of the laminate may be usually 1500 μm or less, preferably 1200 μm or less, and more preferably 1000 μm or less.

The base material may be colorless and transparent, or may be colorless and opaque. The base material may be colored transparent, or may be colored opaque (one having concealing property). The coloring and transparency/non-transparency of the base material can be appropriately selected in consideration of the application of the laminate.

When high visible light transmittance is to be imparted to the organic/inorganic hybrid film, from the viewpoint of utilizing the high visible light transmittance of the organic/inorganic hybrid film, the visible light transmittance of the base material may be usually 80% or more, preferably 85% or more, more preferably 88% or more, still more preferably 90% or more, and most preferably 92% or more. In this case, the visible light transmittance of the base material is preferably as high as possible. Herein, the visible light transmittance is a percentage of the area obtained by integrating the transmission spectrum in the wavelength region of 400 to 780 nm relative to the area obtained by integrating the transmission spectrum in the wavelength region of 400 to 780 nm on the assumption that the transmittance is 100% in the entire range with a wavelength of 400 to 780 nm. The visible light transmittance can be measured, for example, in accordance with 6.4 Visible light transmittance test of JIS A 5759:2008 using a spectrophotometer "SolidSpec-3700" (trade name) available from Shimadzu Corporation.

The thickness of the composite film can be appropriately selected in consideration of properties and functions to be imparted to the composite film and applications of the laminate.

The thickness of the composite film may be usually 1 μm or less, preferably 500 nm or less, more preferably 200 nm or less, still more preferably 150 nm or less, and most preferably 120 nm or less from the viewpoint of crack resistance.

Meanwhile, the thickness of the composite film may be usually 1 nm or more, preferably 10 nm or more, more preferably 20 nm or more, still more preferably 30 nm or more, and most preferably 40 nm or more from the viewpoint of reliably achieving the properties and functions to be imparted by the composite film.

The thickness of the organic/inorganic hybrid film can be appropriately selected in consideration of properties and functions to be imparted to the organic/inorganic hybrid film and applications of the laminate.

The thickness of the organic/inorganic hybrid film may be usually 1 μm or less, preferably 500 nm or less, more preferably 200 nm or less, still more preferably 150 nm or less, and most preferably 120 nm or less from the viewpoint of crack resistance.

Meanwhile, the thickness of the organic/inorganic hybrid film may be usually 1 nm or more, preferably 10 nm or more, more preferably 20 nm or more, still more preferably 30 nm or more, and most preferably 40 nm or more from the viewpoint of reliably achieving the properties and functions to be imparted by the organic/inorganic hybrid film.

5. First Embodiment

An embodiment that is a method for producing an organic/inorganic hybrid film of the present invention is illustratively described, in which a roll-to-roll sputtering device whose conceptual diagram is shown in FIG. 1 is used.

First, targets 9 and 9' that are inorganic substances are mounted on target installation jigs 8 and 8', respectively. The target 9 that is an inorganic substance and the target 9' that is an inorganic substance may be targets of the same inorganic substance or targets of inorganic substances different from each other.

The target 9 that is an inorganic substance and the target 9' that is an inorganic substance may be preferably targets of the same inorganic substance from the viewpoint of uniformity of the composition of the organic/inorganic hybrid film.

Then, a film base material 10 is beforehand taken in the device. Specifically, a film roll 12 of the film base material 10 is set on an unwinding roll 2, a winding tube (not shown) is set on a winding roll 5, and the film base material 10 is unwound from the film roll 12 and held on a sputtering roll 4 via a transfer roll 3 so that the film base material 10 can be wound on the winding tube set on the winding roll 5 via a transfer roll 3'. The film base material 10 may be taken in the device before the targets 9 and 9' that are inorganic substances are mounted on the target installation jigs 8 and 8', respectively.

Then, the inside of a sputtering chamber 1 is exhausted from an exhaust port 7 by an exhaust device so that the pressure inside the sputtering chamber 1 during the film formation may be reduced to a pressure equal to or less than a predetermined pressure. The reduced pressure may be usually about $10^{-5}$ to $10^{-2}$ Pa, and preferably about $10^{-4}$ to $6\times10^{-3}$ Pa.

Then, a mixed gas of the sputtering gas and a gas of the organic compound is introduced into the sputtering chamber 1 from a sputtering gas inlet 6 so that the inside of the sputtering chamber 1 may have a predetermined pressure (i.e., a pressure equal to or greater than the reduced pressure: the reduced pressure or a pressure greater than the reduced pressure) during the film formation. At this time, it is possible to individually prepare the sputtering gas and the gas of the organic compound and introduce gas streams of both the gases while merging and mixing the gas streams, or to prepare the mixed gas of the sputtering gas and the organic compound in advance and introduce the mixed gas. In addition, it is also possible to feedback-control the opening degree of the exhaust port 7 with the introduction amount of the mixed gas being fixed to keep the sputtering pressure constant.

The mixing ratio of the sputtering gas to the gas of the organic compound can be appropriately determined from the viewpoint of ensuring that the composition of the organic/inorganic hybrid film (the ratio of the number of atoms derived from the inorganic substance to the number of atoms derived from the organic compound) is as desired and the viewpoint of sputtering efficiency. The mixing ratio of the sputtering gas to the gas of the organic compound (volume of the sputtering gas/volume of the gas of the organic compound: in terms of a standard state ($0°$ C. and 1 atm)) may be usually 60/40 to 99.999/0.001, preferably 60/40 to 99.99/0.01, 70/30 to 99.999/0.001, or 70/30 to 99.99/0.01, more preferably 60/40 to 99.95/0.05, 70/30 to 99.95/0.05, 80/20 to 99.999/0.001, 80/20 to 99.99/0.01, or 80/20 to 99.95/0.05, and still more preferably 60/40 to 99.9/0.1, 70/30 to 99.9/0.1, 80/20 to 99.9/0.1, 90/10 to 99.999/0.001, 90/10 to 99.99/0.01, 90/10 to 99.95/0.05, or 90/10 to 99.9/0.1, depending on the kind of the organic compound.

The sputtering gas is not particularly limited as long as it is a gas that can be used in sputtering, and it may be any known sputtering gas. Examples of the sputtering gas include inert gases such as at least one gas selected from argon and krypton; and a mixed gas of the inert gas with another gas such as at least one gas selected from oxygen and nitrogen. When a mixed gas of the inert gas and another gas is used as the sputtering gas, although not particularly limited, the mixing volume ratio between the gases may be 1/99 to 99/1 or 5/95 to 95/5.

When an organic compound that becomes gaseous by heating (usually, the temperature is equal to or less than the upper limit temperature at which the film base material can be practically used) or/and pressure reduction is used as the organic compound, it goes without saying that the organic compound is brought into a gaseous state at a predetermined temperature and a predetermined pressure in advance and then used. In this case, the temperature in the sputtering chamber 1 is also preferably set to the predetermined temperature.

The predetermined pressure of the sputtering chamber 1 (i.e., the sputtering pressure) during the film formation may be usually 0.05 to 5 Pa, and preferably 0.1 to 1 Pa from the viewpoint of stabilizing discharge and enabling continuous film formation.

Subsequently, predetermined electric power (usually, high frequency power) is supplied to each of the targets 9 and 9' that are inorganic substances to perform discharging, and when the discharge state is stabilized, an organic/inorganic hybrid film is formed on a surface of the film base material 10 while the film base material 10 is caused to travel at a predetermined line speed. At this time, cooling water having a predetermined temperature is caused to flow through the target installation jigs 8 and 8' at a predetermined flow rate, and the temperature of the targets 9 and 9' that are inorganic substances is controlled to a predetermined temperature.

Although not intended to be bound by theory, the reason why the formed sputtered film is an organic/inorganic hybrid film even though electric power is directly supplied only to the target that is the inorganic substance can be described as follows. This is because the gas of the organic compound present in the vicinity of the target that is the inorganic substance is captured by the magnetic field generated by the supply of electric power to the target that is the inorganic substance, and collides with the sputtering gas present at a high density in the magnetic field and the plasma-converted sputtering gas, and repelled. In other words, it is considered that the gas of the organic compound is also sputtered concomitantly because electric power is supplied to the target that is the inorganic substance and the target is sputtered.

The composition of the organic/inorganic hybrid film (the ratio of the number of atoms derived from the inorganic substance to the number of atoms derived from the organic compound) can be set as desired by adjusting the electric power supplied to the targets 9 and 9' that are inorganic substances and the mixing ratio of the sputtering gas to the gas of the organic compound. The relationship between both the supplied electric power and the mixing ratio and the composition of the film can be determined by performing a preliminary experiment.

The film thickness of the organic/inorganic hybrid film can be set as desired by adjusting the electric power supplied to the targets 9 and 9' that are inorganic substances, the mixing ratio of the sputtering gas to the gas of the organic compound, the flow rate of the mixed gas of the sputtering gas and the gas of the organic compound (the pressure inside the sputtering chamber 1 during the film formation), and the line speed (the traveling speed of the film base material 10). The relationship between the supplied electric power, the mixing ratio, the flow rate of the mixed gas, and the line speed and the film thickness can be determined by performing a preliminary experiment. In addition, the film base material 10 may be reciprocated by a predetermined distance to pass through positions on the sputtering roll 4 that face the targets 9 and 9' that are inorganic substances (i.e., positions at which the organic/inorganic hybrid film is formed) twice or more. When the line speed (traveling speed of the film base material 10) is increased, it is possible to reduce troubles such as bending of the film base material 10 by heat and cracking of the organic/inorganic hybrid film due to bending of the film base material 10. It is also possible to easily secure a stable line speed even when an organic/inorganic hybrid film to be produced is made thicker.

The film thickness of the organic/inorganic hybrid film can be appropriately determined in consideration of the function to be imparted to the organic/inorganic hybrid film and the application of the laminate or the shaped body having the organic/inorganic hybrid film on at least one surface of the film base material.

When low ultraviolet transmittance is to be imparted to the organic/inorganic hybrid film, the film thickness of the organic/inorganic hybrid film may be usually 1 nm or more, preferably 10 nm or more, more preferably 20 nm or more, still more preferably 30 nm or more, and most preferably 40 nm or more from the viewpoint of lowering the ultraviolet transmittance. Meanwhile, the film thickness may be usually 1 μm or less, preferably 500 nm or less, more preferably 200 nm or less, still more preferably 150 nm or less, and most preferably 120 nm or less from the viewpoint of crack resistance.

After the organic/inorganic hybrid film is formed, it is preferable to perform an annealing treatment at a temperature of 50° C. or more, preferably 80° ° C. or more, more preferably 100° C. or more, and at a temperature equal to or less than an upper limit temperature determined in consideration of the heat resistance of the film base material 10, preferably 150° ° C. or less from the viewpoint of operability and productivity. In this manner, the properties of the organic/inorganic hybrid film can be stabilized.

6. Second Embodiment

Figure 3:
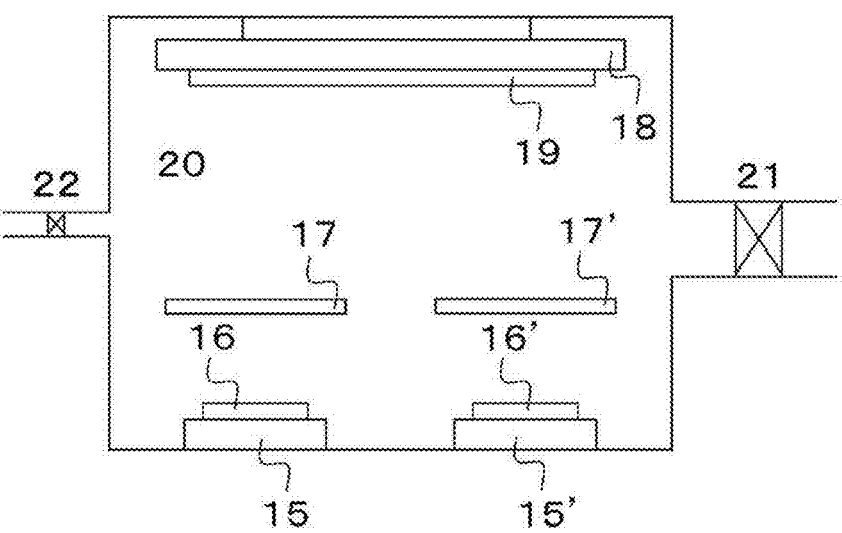
FIG. 3 is a conceptual diagram showing an example of a batch sputtering device.

An embodiment that is a method for producing an organic/inorganic hybrid film of the present invention is illustratively described, in which a batch sputtering device whose conceptual diagram is shown in FIG. 3 is used.

First, targets 16 and 16' that are inorganic substances are mounted on target installation jigs 15 and 15', respectively. The target 16 that is an inorganic substance and the target 16' that is an inorganic substance may be targets of the same inorganic substance or targets of inorganic substances different from each other.

The target 16 that is an inorganic substance and the target 16' that is an inorganic substance may be preferably targets of the same inorganic substance from the viewpoint of uniformity of the composition of the organic/inorganic hybrid film.

Then, a base material 19 is attached to a sputtering table 18 and the sputtering table 18 is rotated at a predetermined rotation speed. The predetermined rotation speed of the sputtering table 18 may be usually 1 to 1000 rotations/minute, and preferably 2 to 50 rotations/minute. In addition, during the formation of the organic/inorganic hybrid film, the rotation speed may be constant, or may be changed as desired.

Then, the inside of a sputtering chamber 20 is exhausted from an exhaust port 21 by an exhaust device so that the pressure inside the sputtering chamber 20 during the film formation may be reduced to a pressure equal to or less than a predetermined pressure. The reduced pressure may be usually about $10^{-5}$ to $10^{-2}$ Pa, and preferably about $10^{-4}$ to $5\times10^{-3}$ Pa.

Then, a mixed gas of the sputtering gas and a gas of the organic compound is introduced into the sputtering chamber 20 from a sputtering gas inlet 22 so that the inside of the sputtering chamber 20 may have a predetermined pressure (i.e., a pressure equal to or greater than the reduced pressure: the reduced pressure or a pressure greater than the reduced pressure) during the film formation. At this time, it is possible to individually prepare the sputtering gas and the gas of the organic compound and introduce gas streams of both the gases while merging and mixing the gas streams, or to prepare the mixed gas of the sputtering gas and the organic compound in advance and introduce the mixed gas. In addition, it is also possible to feedback-control the opening degree of the exhaust port 21 with the introduction amount of the mixed gas being fixed to keep the sputtering pressure constant.

The mixing ratio of the sputtering gas to the gas of the organic compound can be appropriately determined from the viewpoint of ensuring that the composition of the organic/inorganic hybrid film (the ratio of the number of atoms derived from the inorganic substance to the number of atoms derived from the organic compound) is as desired and the viewpoint of sputtering efficiency. The mixing ratio of the sputtering gas to the gas of the organic compound (volume of the sputtering gas/volume of the gas of the organic compound: in terms of a standard state (0° C. and 1 atm)) may be usually 60/40 to 99.999/0.001, preferably 60/40 to 99.99/0.01, 70/30 to 99.999/0.001, or 70/30 to 99.99/0.01, more preferably 60/40 to 99.95/0.05, 70/30 to 99.95/0.05, 80/20 to 99.999/0.001, 80/20 to 99.99/0.01, or 80/20 to 99.95/0.05, and still more preferably 60/40 to 99.9/0.1, 70/30 to 99.9/0.1, 80/20 to 99.9/0.1, 90/10 to 99.999/0.001, 90/10 to 99.99/0.01, 90/10 to 99.95/0.05, or 90/10 to 99.9/0.1, depending on the kind of the organic compound.

The sputtering gas is not particularly limited as long as it is a gas that can be used in sputtering, and it may be any known sputtering gas. Examples of the sputtering gas include inert gases such as at least one gas selected from argon and krypton; and a mixed gas of the inert gas with another gas such as at least one gas selected from oxygen and nitrogen. When a mixed gas of the inert gas and another gas is used as the sputtering gas, although not particularly limited, the mixing volume ratio between the gases may be 1/99 to 99/1 or 5/95 to 95/5.

When an organic compound that becomes gaseous by heating (usually; the temperature is equal to or less than the upper limit temperature at which the base material can be practically used) or/and pressure reduction is used as the organic compound, it goes without saying that the organic compound is brought into a gaseous state at a predetermined temperature and a predetermined pressure in advance and then used. In this case, the temperature in the sputtering chamber 20 is also preferably set to the predetermined temperature.

The predetermined pressure of the sputtering chamber 20 (i.e., the sputtering pressure) during the film formation may be usually 0.05 to 5 Pa, and preferably 0.1 to 1 Pa from the viewpoint of stabilizing discharge and enabling continuous film formation.

Subsequently, predetermined electric power (usually, high frequency power) is supplied to each of the targets 16 and 16' that are inorganic substances to perform discharging, and when the discharge state is stabilized, shutters 17 and 17' are opened and each of the targets is sputtered to form an organic/inorganic hybrid film on a surface of the base material 19. At this time, cooling water having a predetermined temperature is caused to flow through the target installation jigs 15 and 15' at a predetermined flow rate, and the temperature of the targets 16 and 16' that are inorganic substances is controlled to a predetermined temperature. In addition, the shutters 17 and 17 may be closed until the discharge state is stabilized, by which, during pre-sputtering (i.e., an operation of removing (or scattering/evaporating by supply of electric power) contaminants such as dirt and water on the surfaces of the targets 16 and 16'), it is possible to prevent the contaminants from adhering onto the surface of the base material 19.

The composition of the organic/inorganic hybrid film (the ratio of the number of atoms derived from the inorganic substance to the number of atoms derived from the organic compound) can be set as desired by adjusting the electric power supplied to the targets 16 and 16' that are inorganic substances, the mixing ratio of the sputtering gas to the gas of the organic compound, and the flow rate of the mixed gas of the sputtering gas and the gas of the organic compound (the pressure inside the sputtering chamber 20 during the film formation). The relationship between the supplied electric power, the mixing ratio, and the flow rate of the mixed gas and the composition of the film can be determined by performing a preliminary experiment.

The film thickness of the organic/inorganic hybrid film can be set as desired by adjusting the electric power supplied to the targets 16 and 16' that are inorganic substances, the mixing ratio of the sputtering gas to the gas of the organic compound, the flow rate of the mixed gas of the sputtering gas and the gas of the organic compound (the pressure inside the sputtering chamber 20 during the film formation), and the time for film formation. The relationship between the supplied electric power, the mixing ratio, the flow rate of the mixed gas, and the time for film formation and the film thickness can be determined by performing a preliminary experiment.

The film thickness of the organic/inorganic hybrid film can be appropriately determined in consideration of the function to be imparted to the organic/inorganic hybrid film and the application of the laminate or the shaped body having the organic/inorganic hybrid film on at least one surface of the base material.

When low ultraviolet transmittance is to be imparted to the organic/inorganic hybrid film, the film thickness of the organic/inorganic hybrid film may be usually 1 nm or more, preferably 10 nm or more, more preferably 20 nm or more, still more preferably 30 nm or more, and most preferably 40 nm or more from the viewpoint of lowering the ultraviolet transmittance. Meanwhile, the film thickness may be usually 1 μm or less, preferably 500 nm or less, more preferably 200 nm or less, still more preferably 150 nm or less, and most preferably 120 nm or less from the viewpoint of crack resistance.

After the organic/inorganic hybrid film is formed, it is preferable to perform an annealing treatment at a temperature of 50° C. or more, preferably 80° C. or more, more preferably 100° C. or more, and at a temperature equal to or less than an upper limit temperature determined in consideration of the heat resistance of the base material 19, preferably 150° C. or less from the viewpoint of operability and productivity. In this manner, the properties of the organic/inorganic hybrid film can be stabilized.

In the organic/inorganic hybrid film, what kind of compound is formed by the inorganic substance and the organic compound used as raw materials can be examined by X-ray photoelectron spectroscopy (hereinafter sometimes abbreviated as "XPS analysis"). The XPS analysis can be performed using, for example, an XPS analyzer and using aluminum Kα rays or magnesium Kα rays as X-rays. For the XPS analysis, the following literature can be made reference to, for example.

Reference: M. P. Seah and W. A. Derch, Surface and Interface Analysis 1, 2 (1979)

EXAMPLES

Hereinafter, the present invention is described with reference to examples, but the present invention is not limited thereto.
Method for Measuring Physical Properties
(i) Sputtering Thickness of Film
The sputtering thickness of the film was determined by a preliminary experiment. First, a heat-resistant and low-outgassing adhesive tape ("Kapton Tape P-221" (trade name) manufactured by Nitto Denko Corporation) was partially attached to a base material in advance, and the adhesive tape was peeled off after sputtering to form a step corresponding to the film thickness. The shape profile of the step part was determined at a measurement speed of 0.5 mm/s and a measurement distance of 1.5 mm using a small surface roughness measuring machine "SJ-411" (trade name) available from Mitutoyo Corporation, and the level of the step read therefrom was taken as the sputtering thickness of the film.
(ii) Analysis of Sputtered Film by X-Ray Photoelectron Spectroscopy (XPS Analysis)
With the use of an XPS analyzer ("K-Alpha" (trade name) available from Thermo Fisher Scientific K.K.), a wide scan spectrum was measured under the conditions of an irradiation diameter of 400 μm, an electron extraction angle of 90 degrees, a pass energy of 200 eV, a measurement range of −10 to 1350 eV, an energy step of 1.000 eV, a time of one step of 10 ms, and the number of measurements of 10 times using a monochromatized aluminum Kα ray as an X-ray.

For an energy region belonging to a Is orbital of the fluorine atom (F1s), an F1s narrow scan spectrum was measured under the conditions of an electron extraction angle of 90 degrees, a pass energy of 50 eV, a measurement range of 678 to 698 eV, an energy step of 0.100 eV, a time of one step of 50 ms, and the number of measurements of 10 times.
Raw Materials Used
(A) Target that is Substance Solid in Standard State (Temperature of 25° C. and Pressure of 100 KPa)
(A-1) A disk-shaped target having a diameter of 76.2 mm and a thickness of 3 mm, which was obtained by sintering cerium dioxide available from USTRON CORPORATION. Purity: 4 N.
(A-2) A rectangular parallelepiped target having a length of 127 mm, a width of 380 mm, and a thickness of 3 mm, which was obtained by sintering cerium dioxide available from USTRON CORPORATION. Purity: 4 N.
(A-3) A disk-shaped target having a diameter of 76.2 mm and a thickness of 3 mm, which is polydimethylsiloxane (a silicone resin containing no fluorine atom).
(B) Gas of Organic Compound
(B-1) Tetrafluoromethane (grade having a purity of 99.999% or more).
(C) Base Material
(C-1) A smooth soda lime glass plate (product name: Micro slide glass, water edge grinding product, thickness: 1.0 mm, dimensions: 40×40 mm) available from Matsunami Glass Ind., Ltd.
(C-2) A double-sided easily adhesive biaxially stretched polyethylene terephthalate resin film "Lumirror" (trade name) having a thickness of 125 μm, available from Toray Industries, Inc.

Example 1

Using a batch sputtering device, an organic/inorganic hybrid film was formed on one surface of the base material (C-1) with the target (A-1) and the gas (B-1). First, the target (A-1) was mounted on a target installation jig of the sputtering device. Then, the pressure inside the sputtering chamber of the sputtering device was reduced to 3.0×10⁻³ Pa. Then, a gas stream (volume flow rate 23.4 sccm) of an argon gas (grade having a purity of 99.999% or more) as a sputtering gas and a gas stream (volume flow rate 2.6 sccm) of the gas (B-1) were introduced into the sputtering chamber while being merged and mixed, and the opening degree of shutter of an exhaust pipe portion was adjusted so that the pressure inside the sputtering chamber was 0.8 Pa. Subsequently, electric power was supplied to the target (A-1) under the condition of a supplied electric power of 200 W (i.e., with a supplied electric power per unit area: 4.4 W/cm$^2$), and sputtering was performed to form a sputtered film on one surface of the base material (C-1). The film formation time in this case was 30 minutes, and the film formation conditions were such that the sputtered film had a thickness of 165 nm.

Figure 4:
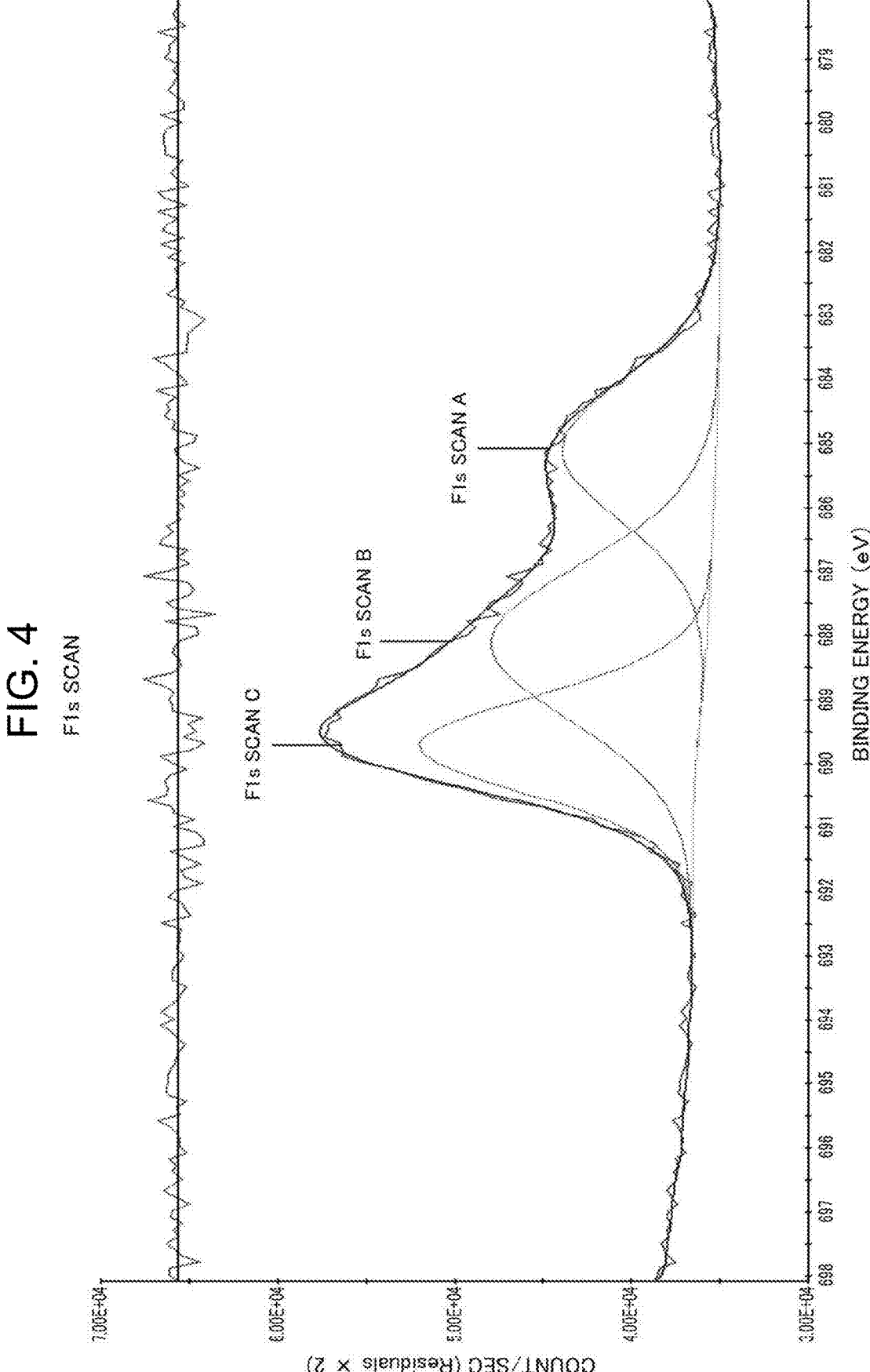
FIG. 4 shows a spectrum obtained by subjecting a sputtered film (organic/inorganic hybrid film) of Example 1 to XPS analysis for an energy region belonging to a Is orbital of the fluorine atom.
Figure 5:
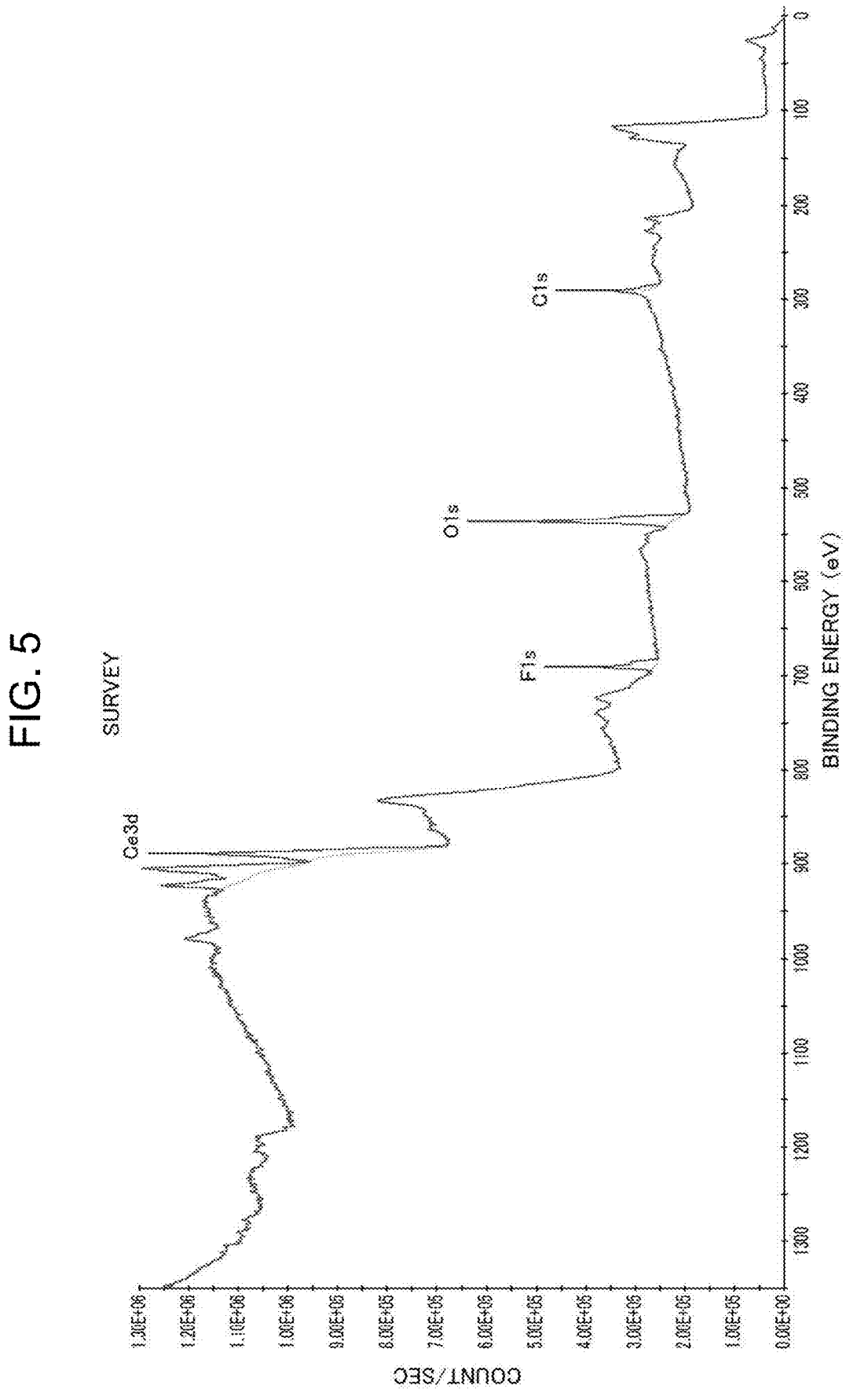
FIG. 5 shows a spectrum obtained by subjecting the sputtered film (organic/inorganic hybrid film) of Example 1 to XPS analysis for an energy region of −10 to 1350 eV.

The sputtered film was subjected to XPS analysis. The analysis results are shown in FIGS. 4 and 5. In the F1s narrow scan spectrum in FIG. 4, a peak derived from a F—Ce bond appeared at 685.7 eV, and thus it was found that a fluorine atom derived from tetrafluoromethane modified cerium dioxide to produce cerium trifluoride. The atomic number ratio of fluorine to cerium (F/Ce) calculated from the wide scan spectrum in FIG. 5 was 3.7. From these results, it was found that the sputtered film was an organic/inorganic hybrid film, that is, an organic/inorganic hybrid film can be formed by the method of the present invention.

In the present description, the unit "sccm" of volume flow rate is the volume of a gas flowing in one minute, which is normalized in a standard state (a temperature of 0° C. and 1 atm).

Example 2

A sputtered film was formed in the same manner as in Example 1 except that a gas stream (volume flow rate: 20.8 sccm) of an argon gas as a sputtering gas and a gas stream (volume flow rate: 5.2 sccm) of the gas (B-1) were introduced into the sputtering chamber while being merged and mixed. The film formation time in this case was 30 minutes, and the film formation conditions were such that the sputtered film had a thickness of 200 nm.

Figure 6:
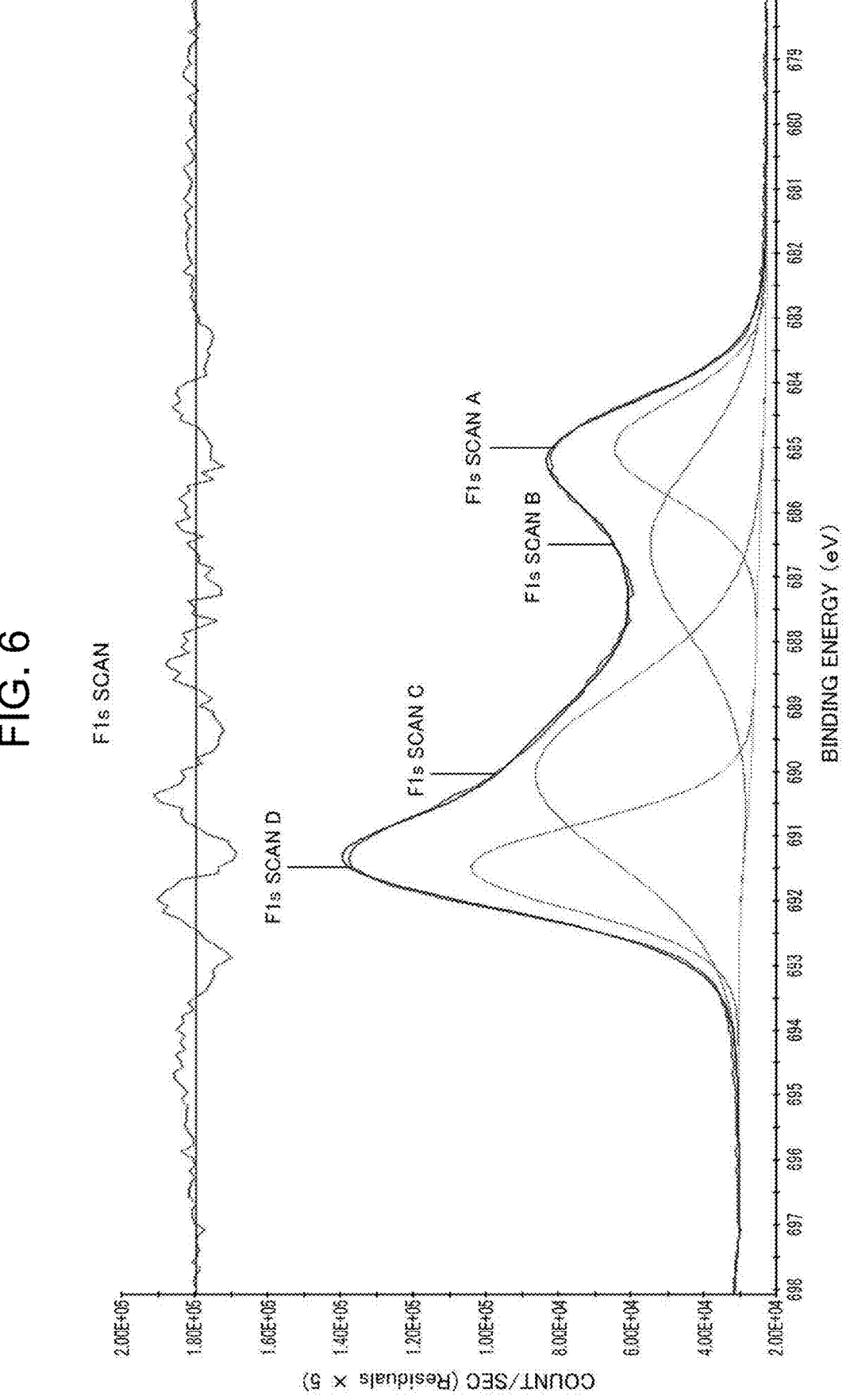
FIG. 6 shows a spectrum obtained by subjecting a sputtered film (organic/inorganic hybrid film) of Example 2 to XPS analysis for an energy region belonging to a Is orbital of the fluorine atom.
Figure 7:
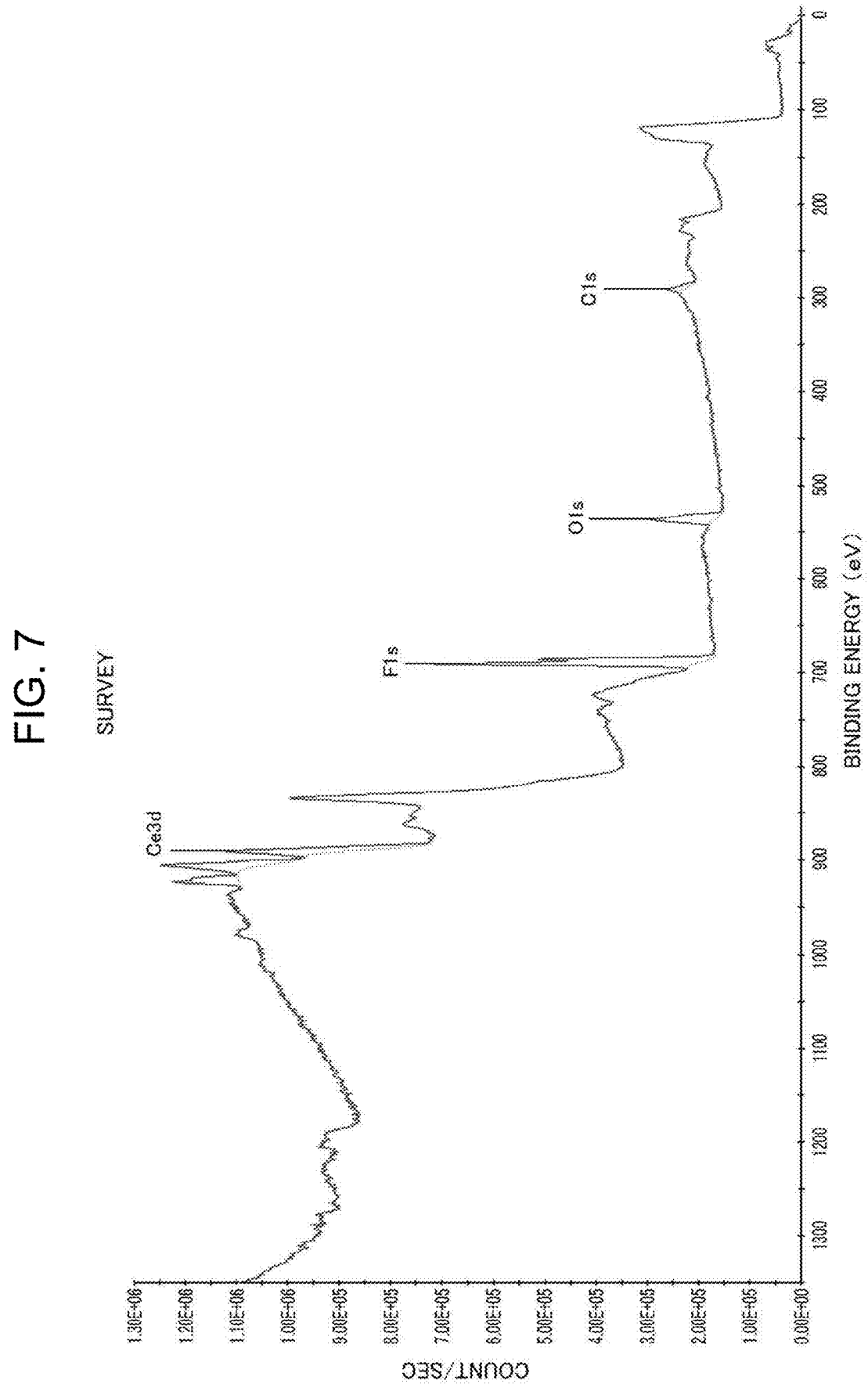
FIG. 7 shows a spectrum obtained by subjecting the sputtered film (organic/inorganic hybrid film) of Example 2 to XPS analysis for an energy region of −10 to 1350 eV.

The sputtered film was subjected to XPS analysis. The analysis results are shown in FIGS. 6 and 7. In the F1s narrow scan spectrum in FIG. 6, a peak derived from a F—Ce bond appeared at 685.0 eV similarly to Example 1, and thus it was found that a fluorine atom derived from tetrafluoromethane modified cerium dioxide to produce cerium trifluoride. The atomic number ratio of fluorine to cerium (F/Ce) calculated from the wide scan spectrum in FIG. 7 was 7.4. From these results, it was shown that the composition of the sputtered film (organic/inorganic hybrid film) can be adjusted by the mixing ratio of the sputtering gas to the gas of the organic compound.

Example 3

With the use of a roll-to-roll sputtering device shown in the conceptual diagram of FIG. 1, an organic/inorganic hybrid film was formed on one surface of the base material (C-2) using the target (A-2) and the gas (B-1).

First, the base material (C-2) was beforehand taken in the sputtering device, and then the target (A-2) (the target 9) was mounted on the target installation jig 8.

The target installation jig 8' was not used. That is, the number of the target (A-2) used is 1.

Then, the pressure inside the sputtering chamber 1 of the sputtering device was reduced to $5.0 \times 10^{-3}$ Pa.

Then, a gas stream (volume flow rate 190 sccm) of an argon gas (grade having a purity of 99.999% or more) as a sputtering gas and a gas stream (volume flow rate 10 sccm) of the gas (B-1) were introduced into the sputtering chamber 1 while being merged and mixed, and the opening degree of shutter of the exhaust port 7 was adjusted so that the pressure inside the sputtering chamber 1 was 0.4 Pa.

Subsequently, while the base material (C-2) was wound at a line speed of 1.0 m/min, electric power was supplied to the target (A-2) (the target 9) under the condition of a supplied electric power of 1500 W (i.e., with a supplied electric power per unit area: 3.1 W/cm$^2$), and sputtering was performed to form a sputtered film on one surface of the base material (C-2). In addition, the base material (C-2) was reciprocated by a predetermined distance so as to pass through a position on the sputtering roll 4 that faces the target (A-2) (the target 9) nine times.

The film formation conditions were such that the sputtered film had a thickness of 50 nm.

Figure 8:
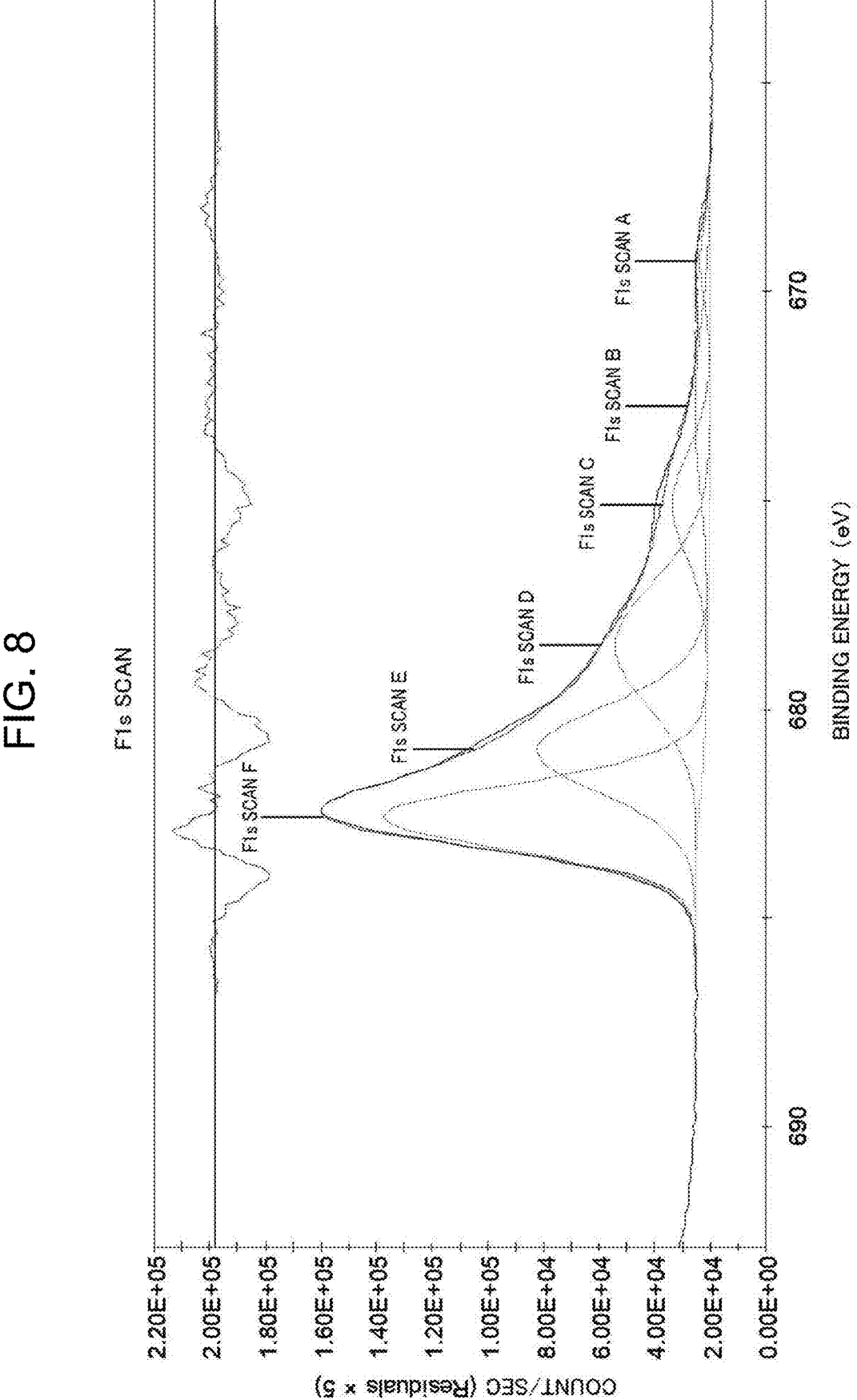
FIG. 8 shows a spectrum obtained by subjecting a sputtered film (organic/inorganic hybrid film) of Example 3 to XPS analysis for an energy region belonging to a Is orbital of the fluorine atom.
Figure 9:
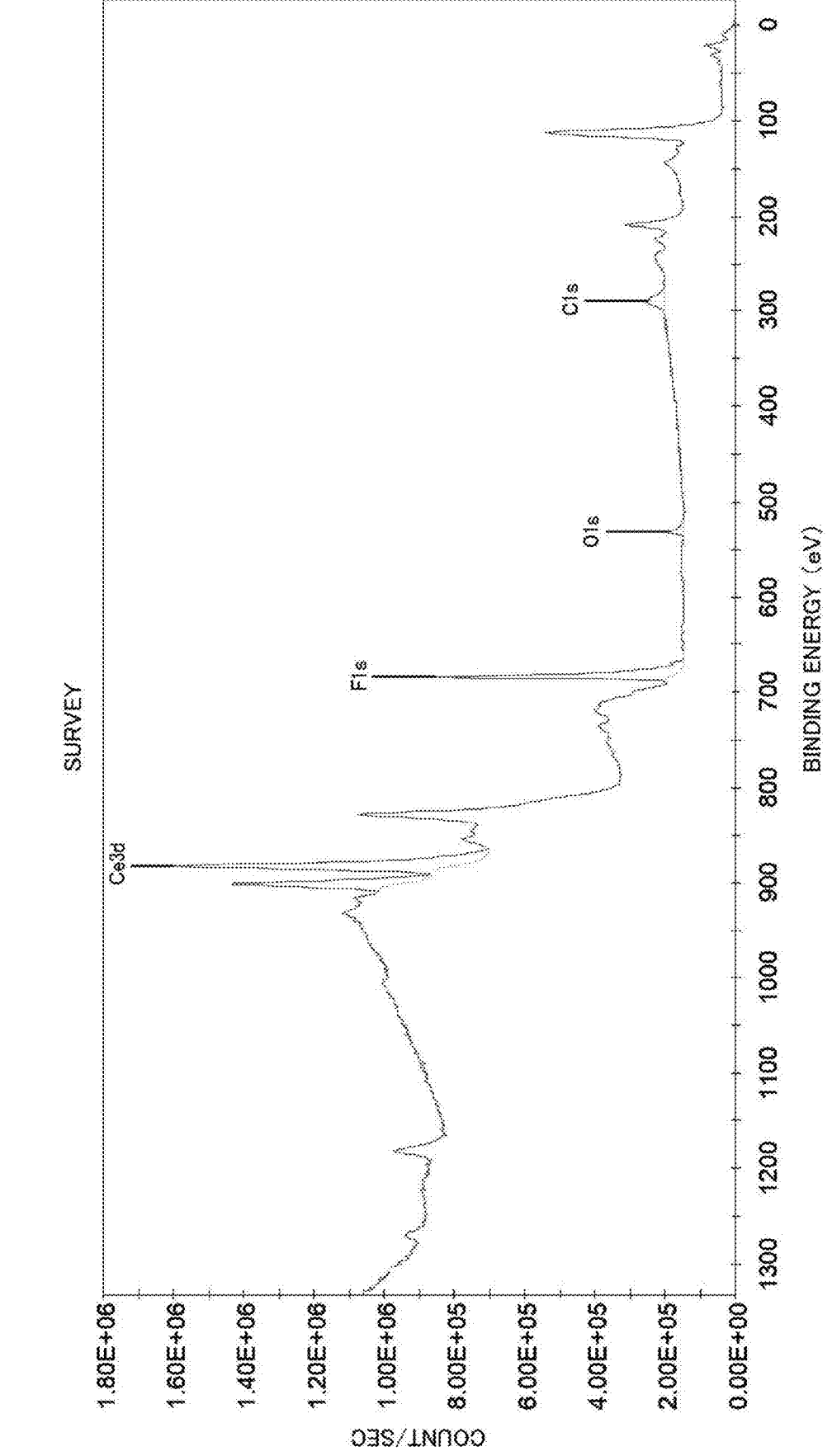
FIG. 9 shows a spectrum obtained by subjecting the sputtered film (organic/inorganic hybrid film) of Example 3 to XPS analysis for an energy region of −10 to 1350 eV.

The sputtered film was subjected to XPS analysis. The analysis results are shown in FIGS. 8 and 9. In the F1s narrow scan spectrum in FIG. 8, a peak derived from a F—Ce bond appeared at 682.5 eV, and thus it was found that a fluorine atom derived from tetrafluoromethane modified cerium dioxide to produce cerium trifluoride. The atomic number ratio of fluorine to cerium (F/Ce) calculated from the wide scan spectrum in FIG. 9 was 3.6. From these results, it was shown that an organic/inorganic hybrid film was formed.

Example 4

A sputtered film was formed in the same manner as in Example 3 except that the flow rate of the gas stream of the argon gas was changed to a volume flow rate of 199 sccm, and the flow rate of the gas stream of the gas (B-1) was changed to 1 sccm.

The film formation conditions were such that the sputtered film had a thickness of 50 nm. The sputtered film was subjected to XPS analysis. The analysis results are shown in FIGS. 10 and 11.

Figure 10:
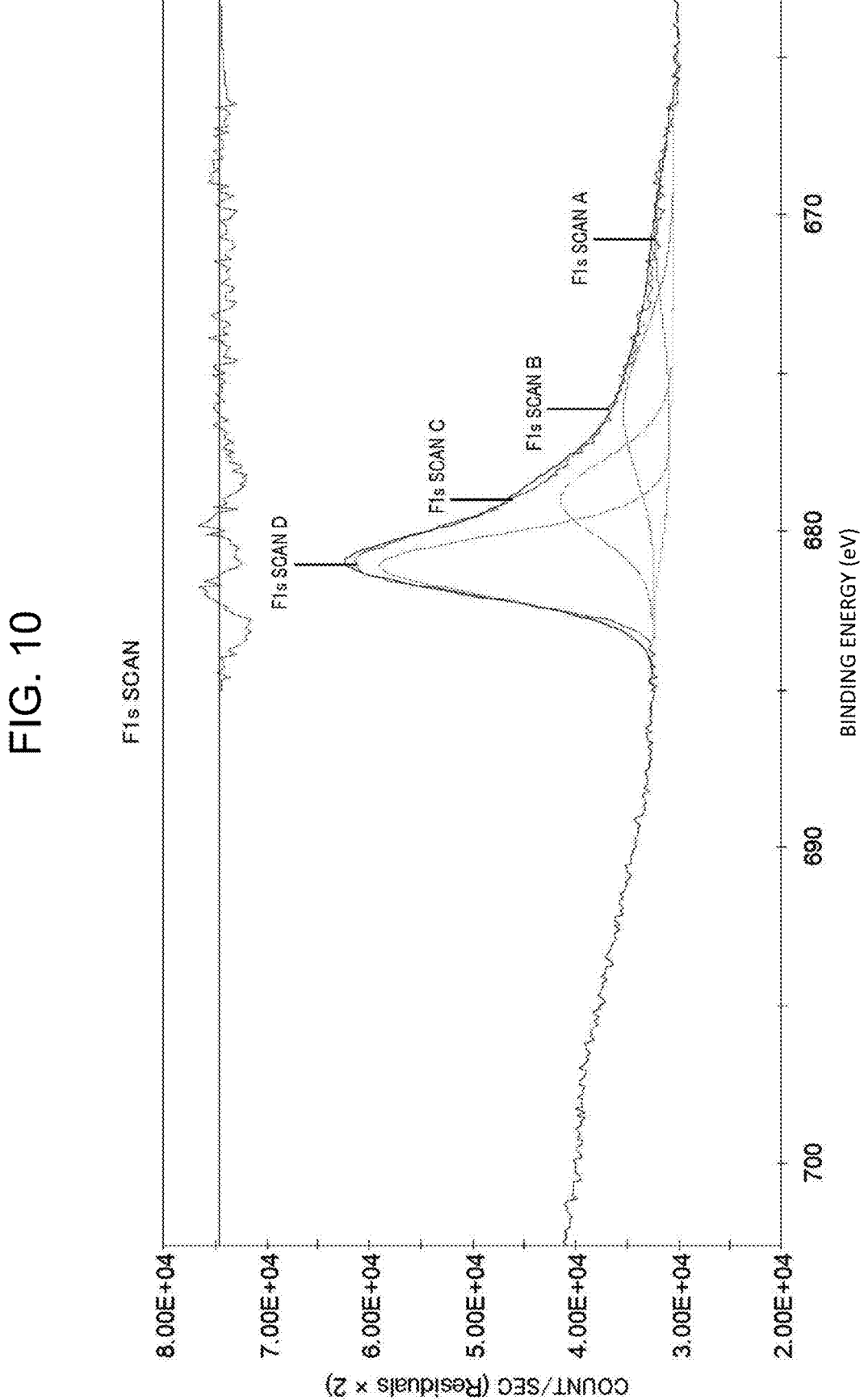
FIG. 10 shows a spectrum obtained by subjecting a sputtered film (organic/inorganic hybrid film) of Example 4 to XPS analysis for an energy region belonging to a Is orbital of the fluorine atom.
Figure 11:
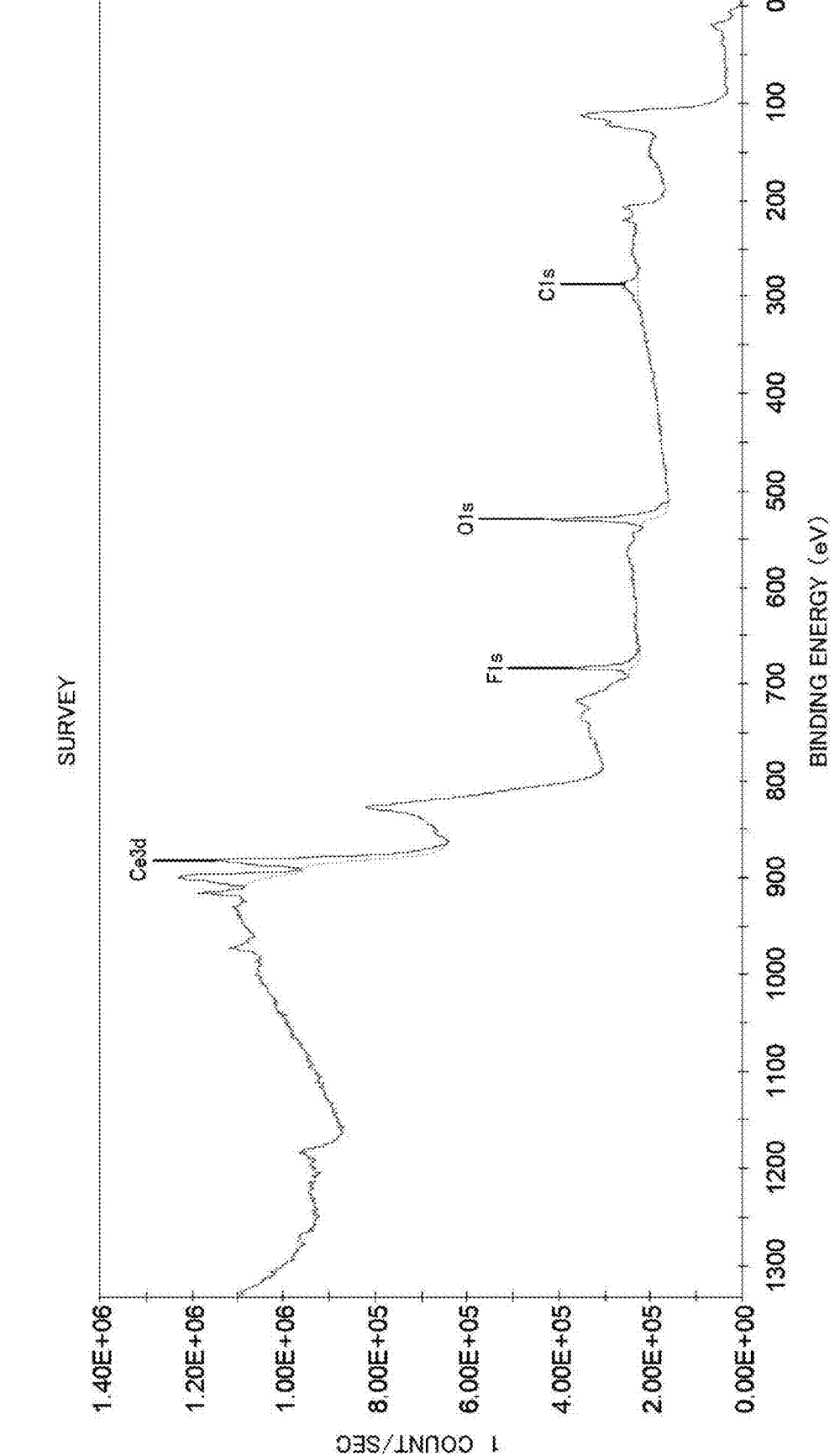
FIG. 11 shows a spectrum obtained by subjecting the sputtered film (organic/inorganic hybrid film) of Example 4 to XPS analysis for an energy region of −10 to 1350 eV.

In the F1s narrow scan spectrum in FIG. 10, a peak derived from a F—Ce bond appeared at 681.5 eV, and thus it was found that a fluorine atom derived from tetrafluoromethane modified cerium dioxide to produce cerium trifluoride. The atomic number ratio of fluorine to cerium (F/Ce) calculated from the wide scan spectrum in FIG. 11 was 1.7. From these results, it was shown that an organic/inorganic hybrid film was formed.

Although the present invention has been specifically described, these are merely illustrative descriptions of the present invention. A person skilled in the art can make various modifications without departing from the essential characteristics of the present invention. A person skilled in the art can employ, for example, the following producing method. In this case, it goes without saying that the present invention may be implemented by appropriately replacing the term "target that is an inorganic compound" in the description with "target that is an organic compound" and the term "organic/inorganic hybrid film" therein with "composite film". Such a producing method may be useful, for example, when a composite film or a modified film in which a fluorine atom is introduced into a silicone resin is formed by using, as a target that is an organic compound, a target that is a silicone resin, and using, as a gas of an organic compound, a gas of an organofluorine compound.

[1].
  A method for producing a composite film, wherein
  a sputtering device is used, and
  a target that is a first organic compound and a gas of a
    second organic compound (an organic compound that
    may be identical with or different from the first organic compound, but usually an organic compound different from the first organic compound) are used, the method comprising the steps of:

(1) mounting the target that is the first organic compound on a target installation jig of the sputtering device;

(2) reducing a pressure inside a sputtering chamber of the sputtering device to a first predetermined pressure;

(3) introducing a mixed gas of a sputtering gas and the gas of the second organic compound into the sputtering chamber of the sputtering device such that the pressure inside the sputtering chamber reaches a second predetermined pressure that is equal to or greater than the first predetermined pressure; and (4) supplying electric power to the target that is the first organic compound and sputtering the target to form a composite film on a surface of a base material.

[2].

The producing method according to item [1], wherein the sputtering device is a roll-to-roll sputtering device.

[3].

The producing method according to item [1] or [2], wherein a mixing ratio in the mixed gas (volume of the sputtering gas/volume of the gas of the second organic compound: in terms of a standard state ($0°$ C. and 1 atm)) is 60/40 to 99.999/0.001.

[4].

The producing method according to any one of items [1] to [3], wherein the gas of the second organic compound contains a gas of one or more compounds selected from the group consisting of a compound that has a structure in which one or two or more hydrogen atoms of a saturated hydrocarbon are substituted with a fluorine atom and is gaseous in a standard state (a temperature of $25°$ ° C. and a pressure of 100 KPa), and a compound that has a structure in which one or two or more hydrogen atoms of an unsaturated hydrocarbon are substituted with a fluorine atom and is gaseous in a standard state (a temperature of $25°$ ° C. and a pressure of 100 KPa).

[5].

The producing method according to any one of items [1] to [4], wherein the target that is the first organic compound contains a silicone resin.

Example 5

A sputtered film was formed in the same manner as in Example 1 except that the target (A-3) was used in place of the target (A-1). The film formation time in this case was 30 minutes, and the film formation conditions were such that the sputtered film had a thickness of 200 nm. The sputtered film was analyzed by a specular reflection method of FT-IR, and as a result, a peak derived from a C—F bond appeared. From this fact, it was shown that a fluorine atom derived from tetrafluoromethane modified the silicone resin, that is, a composite film was formed.

REFERENCE SIGNS LIST

1 Sputtering chamber
2 Unwinding roll
3, 3' Transfer roll
4 Sputtering roll
5 Winding roll
6 Sputtering gas inlet
7 Exhaust port
8, 8' Target installation jig
9, 9' Target 10 Film base material
11 Laminate
12, 12' Film roll
13 Deposition preventive plate
14 Deposition preventive plate attaching jig
15, 15' Target installation jig
16, 16' Target
17, 17 Shutter
18 Sputtering table
19 Base material
20 Sputtering chamber
21 Exhaust port
22 Sputtering gas inlet

The invention claimed is:

1. A method for producing a composite film to form a laminate in combination with a base material for on-site use, comprising:

providing a sputtering device comprising a sputtering chamber and a target (A) that is an inorganic substance solid in a standard state (a temperature of $25°$ C. and a pressure of 100 KPa) and a gas inlet, the sputtering device being without another target that is a solid organic substance;

mounting the target (A) on a target installation jig of the sputtering device;

reducing a pressure inside the sputtering chamber of the sputtering device to a first pressure;

introducing a mixed gas comprising a sputtering gas and a gas (B) containing an organic compound, the organic compound being supplied as a component constituting the composite film, into the sputtering chamber of the sputtering device such that the sputtering chamber reaches a second pressure that is equal to or greater than the first pressure, wherein the introducing of the mixed gas comprises introducing gas streams of both the gases while merging and mixing the gas streams or preparing the mixed gases in advance and introducing the mixed gas; and then supplying electric power to the target (A) and sputtering the target (A) to form the composite film containing the inorganic substance from the target (A) and the organic compound from the gas (B) contained in the mixed gas on a surface of the base material so as to obtain the laminate combined with the base material for on-site use, wherein the target (A) has a band gap in a range of 2.6 to 3.7 eV, wherein the composite film is uniform in both film thickness and composition, and wherein the base material comprises a resin.

2. The method according to claim 1, wherein the sputtering device is a roll-to-roll sputtering device.

3. The method according to claim 1, wherein a mixing ratio in the mixed gas (volume of the sputtering gas/volume of the gas (B)) is in a range of 60/40 to 99.999/0.001.

4. The method according to claim 1, wherein the gas (B) contains one or more compounds selected from the group consisting of a compound that has a structure in which one or two or more hydrogen atoms of a saturated hydrocarbon are substituted with a fluorine atom and is gaseous in a standard state, and a compound that has a structure in which one or two or more hydrogen atoms of an unsaturated hydrocarbon are substituted with a fluorine atom and is gaseous in a standard state.

5. The method according to claim 1, wherein the target (A) contains cerium oxide.

6. The method according to claim 1, wherein:

the sputtering device is a roll-to-roll sputtering device;

a mixing ratio in the mixed gas (volume of the sputtering gas/volume of the gas (B)) is in a range of 60/40 to 99.999/0.001; and the gas (B) contains one or more compounds selected from the group consisting of a compound that has a structure in which one or two or more hydrogen atoms of a saturated hydrocarbon are substituted with a fluorine atom and is gaseous in a standard state, and a compound that has a structure in which one or two or more hydrogen atoms of an unsaturated hydrocarbon are substituted with a fluorine atom and is gaseous in a standard state; and the target (A) contains cerium oxide.

7. The method according to claim 1, wherein:

the sputtering device is a roll-to-roll sputtering device;

a mixing ratio in the mixed gas (volume of the sputtering gas/volume of the gas (B)) is in a range of 60/40 to 99.999/0.001; and the gas (B) contains one or more compounds selected from the group consisting of a compound that has a structure in which one or two or more hydrogen atoms of a saturated hydrocarbon are substituted with a fluorine atom and is gaseous in a standard state, and a compound that has a structure in which one or two or more hydrogen atoms of an unsaturated hydrocarbon are substituted with a fluorine atom and is gaseous in a standard state.

8. The method of claim 1, wherein:

the sputtering device is a roll-to-roll sputtering device; and a mixing ratio in the mixed gas (volume of the sputtering gas/volume of the gas (B)) is in a range of 60/40 to 99.999/0.001.

9. The method of claim 1, wherein:

the sputtering device is a roll-to-roll sputtering device; and the gas (B) contains one or more compounds selected from the group consisting of a compound that has a structure in which one or two or more hydrogen atoms of a saturated hydrocarbon are substituted with a fluorine atom and is gaseous in a standard state, and a compound that has a structure in which one or two or more hydrogen atoms of an unsaturated hydrocarbon are substituted with a fluorine atom and is gaseous in a standard state.

10. The method of claim 1, wherein:

the sputtering device is a roll-to-roll sputtering device; and the target (A) contains cerium oxide.

11. The method of claim 1, wherein:

the sputtering device is a roll-to-roll sputtering device;

a mixing ratio in the mixed gas (volume of the sputtering gas/volume of the gas (B)) is in a range of 60/40 to 99.999/0.001; and the target (A) contains cerium oxide.

12. The method of claim 1, wherein a mixing ratio in the mixed gas (volume of the sputtering gas/volume of the gas (B)) is in a range of 60/40 to 99.999/0.001; and the gas (B) contains one or more compounds selected from the group consisting of a compound that has a structure in which one or two or more hydrogen atoms of a saturated hydrocarbon are substituted with a fluorine atom and is gaseous in a standard state, and a compound that has a structure in which one or two or more hydrogen atoms of an unsaturated hydrocarbon are substituted with a fluorine atom and is gaseous in a standard state.

13. The method of claim 1, wherein:

a mixing ratio in the mixed gas (volume of the sputtering gas/volume of the gas (B)) is in a range of 60/40 to 99.999/0.001; and the target (A) contains cerium oxide.

14. The method of claim 1, wherein:

the gas (B) contains one or more compounds selected from the group consisting of a compound that has a structure in which one or two or more hydrogen atoms of a saturated hydrocarbon are substituted with a fluorine atom and is gaseous in a standard state, and a compound that has a structure in which one or two or more hydrogen atoms of an unsaturated hydrocarbon are substituted with a fluorine atom and is gaseous in a standard state; and the target (A) contains cerium oxide.

15. The method of claim 1, wherein:

a mixing ratio in the mixed gas (volume of the sputtering gas/volume of the gas (B)) is in a range of 60/40 to 99.999/0.001; and the gas (B) contains one or more compounds selected from the group consisting of a compound that has a structure in which one or two or more hydrogen atoms of a saturated hydrocarbon are substituted with a fluorine atom and is gaseous in a standard state, and a compound that has a structure in which one or two or more hydrogen atoms of an unsaturated hydrocarbon are substituted with a fluorine atom and is gaseous in a standard state; and the target (A) contains cerium oxide.

16. The method of claim 1, wherein the introduction of the mixed gas is conducted by introducing gas streams of both the gases while merging and mixing the gas streams.

17. The method of claim 1, wherein the introduction of the mixed gas is conducted by preparing the mixed gases in advance and introducing the mixed gas.

18. The method of claim 1, wherein the base material is a resin film, a resin sheet, or a resin plate.

* * * * *